(12) United States Patent
Kajimoto

(10) Patent No.: US 10,637,004 B2
(45) Date of Patent: Apr. 28, 2020

(54) ORGANIC LIGHT-EMITTING ELEMENT

(71) Applicant: CANON KABUSHIKI KAISHA, Tokyo (JP)

(72) Inventor: Norifumi Kajimoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/303,603

(22) PCT Filed: May 8, 2015

(86) PCT No.: PCT/JP2015/063966
§ 371 (c)(1),
(2) Date: Oct. 12, 2016

(87) PCT Pub. No.: WO2015/174508
PCT Pub. Date: Nov. 19, 2015

(65) Prior Publication Data
US 2017/0033317 A1    Feb. 2, 2017

(30) Foreign Application Priority Data
May 12, 2014   (JP) ................. 2014-098509

(51) Int. Cl.
*H01L 51/52*     (2006.01)
*H01L 27/32*     (2006.01)
(Continued)

(52) U.S. Cl.
CPC ....... *H01L 51/5265* (2013.01); *G03G 15/043* (2013.01); *H01L 27/322* (2013.01);
(Continued)

(58) Field of Classification Search
CPC ............ H01L 51/5265; H01L 51/5221; H01L 51/5206; H01L 51/529; H01L 51/504;
(Continued)

(56) References Cited

U.S. PATENT DOCUMENTS 6,936,961 B2    8/2005  Liao et al.
7,803,469 B2    9/2010  Lee et al.
(Continued)

FOREIGN PATENT DOCUMENTS

JP    2004-342614 A    12/2004
JP    2006-318697 A    11/2006
(Continued)

OTHER PUBLICATIONS

C. Han et al., "55-inch FHD OLED TV employing New Tandem WOLEDs", SID 2012 Digest, pp. 279-281 (2012).
(Continued)

*Primary Examiner* — Robert T Huber
*Assistant Examiner* — Gardner W. S. Swan
(74) *Attorney, Agent, or Firm* — Venable LLP

(57) ABSTRACT

Provided is an organic light-emitting element for emitting white light in which an optical distance $L_1$ between a first emission layer (52) and a reflective electrode (80) satisfies Expression (a), and an optical distance $L_2$ between a second emission layer (72) and the reflective electrode (80) satisfies Expression (b):

$$(\lambda_1/8)\times(3-(2\varphi_1/\pi))<L_1<(\lambda_1/8)\times(5-(2\varphi_1/\pi)) \qquad \text{(a); and}$$

$$(\lambda_2/8)\times(-(2\varphi_2/\pi)-1)<L_2<(\lambda_2/8)\times(-(2\varphi_2/\pi)+1) \qquad \text{(b), and}$$

in which a refractive index of a first charge transport layer (51) formed between a light extraction electrode (4) and the first emission layer (52) at the wavelength $\lambda_1$ is 1.70 or less.

18 Claims, 14 Drawing Sheets

(51) Int. Cl.
*H01L 51/50* (2006.01)
*G03G 15/043* (2006.01)
*H05B 45/00* (2020.01)
*H01L 27/12* (2006.01)

(52) U.S. Cl.
CPC ...... *H01L 27/3213* (2013.01); *H01L 27/3262* (2013.01); *H01L 27/3293* (2013.01); *H01L 51/504* (2013.01); *H01L 51/5044* (2013.01); *H01L 51/5206* (2013.01); *H01L 51/529* (2013.01); *H01L 51/5221* (2013.01); *H01L 27/1225* (2013.01); *H01L 2251/55* (2013.01); *H01L 2251/558* (2013.01); *H05B 45/60* (2020.01)

(58) Field of Classification Search
CPC ............... H01L 51/5044; H01L 27/322; H01L 27/3262; H01L 27/3293; H01L 27/3213; H01L 27/1225; H01L 2251/558; H01L 2251/55; G03G 15/043; H05B 33/0896
See application file for complete search history.

(56) References Cited

U.S. PATENT DOCUMENTS

| | | | |
|---|---|---|---|
| 8,410,477 B2 | 4/2013 | Lee et al. | |
| 8,471,463 B2 | 6/2013 | Sumida et al. | |
| 8,581,275 B2 | 11/2013 | Omoto | |
| 8,901,804 B2 | 12/2014 | Yamamoto et al. | |
| 8,963,143 B2 | 2/2015 | Loebl et al. | |
| 8,987,760 B2 | 3/2015 | Omoto | |
| 2004/0227460 A1 | 11/2004 | Liao et al. | |
| 2007/0099026 A1 | 5/2007 | Lee et al. | |
| 2008/0238310 A1 | 10/2008 | Forrest et al. | |
| 2008/0265757 A1 | 10/2008 | Forrest et al. | |
| 2009/0066228 A1 | 3/2009 | Tomai et al. | |
| 2009/0167156 A1 | 7/2009 | Kawamura et al. | |
| 2011/0114981 A1 | 5/2011 | Higaki et al. | |
| 2011/0121272 A1 | 5/2011 | Lee et al. | |
| 2012/0181915 A1 | 7/2012 | Yamamoto et al. | |
| 2012/0187425 A1 | 7/2012 | Omoto | |
| 2013/0038204 A1 | 2/2013 | Sumida et al. | |
| 2013/0038640 A1* | 2/2013 | Kajimoto | H01L 51/5218 345/690 |
| 2013/0056717 A1* | 3/2013 | Ishihara | H01L 51/5265 257/40 |
| 2013/0119357 A1* | 5/2013 | Kim | H01L 51/5048 257/40 |
| 2013/0285027 A1 | 10/2013 | Loebl et al. | |
| 2014/0124765 A1 | 5/2014 | Omoto | |
| 2015/0076467 A1 | 3/2015 | Sasaki et al. | |
| 2017/0256743 A1* | 9/2017 | Uesaka | H01L 51/5265 |

FOREIGN PATENT DOCUMENTS

| | | |
|---|---|---|
| JP | 2007-027092 A | 2/2007 |
| JP | 2010-524153 A | 7/2010 |
| JP | 2011-18451 A | 1/2011 |
| JP | 2011-113973 A | 6/2011 |
| JP | 2012-155953 A | 8/2012 |
| JP | 2013-179248 A | 9/2013 |
| JP | 2014-502041 A | 1/2014 |
| JP | 2014-51448 A | 3/2014 |
| WO | 2008/105294 A1 | 9/2008 |
| WO | 2011/039911 A1 | 4/2011 |
| WO | 2013/190838 A1 | 12/2013 |

OTHER PUBLICATIONS

S. Nowy et al., "Light extraction and optical loss mechanisms in organic light-emitting diodes: Influence of the emiter quantum efficiency", J. Appl. Phys., vol. 104, 123109 (2008).
Notification of Reasons for Refusal dated Mar. 6, 2018, in counterpart application JP 2014-098509 (8 pages).
Office Action dated Oct. 2, 2018 in counterpart application JP2014098509 (7 pages).

* cited by examiner

ORGANIC LIGHT-EMITTING ELEMENT

TECHNICAL FIELD

The present invention relates to an organic light-emitting element, and further, to a display device, an image information processing apparatus, a lighting apparatus, an image forming apparatus, and an exposure device that use such an organic light-emitting element.

BACKGROUND ART

In recent years, an organic light-emitting element, which is self-emissive with a low drive voltage of several volts, has attracted attention. An organic light-emitting element generally has a structure in which a reflective electrode having a metal reflecting layer, an emission layer, and a light extraction electrode are stacked. Such an organic light-emitting element has excellent characteristics such as surface emitting characteristics, light weight, and visibility, and due to its characteristics, is being commercialized as a light-emitting device for, for example, a thin display, a lighting apparatus, or a head-mounted display, or as a light source for a print head of an electrophotographic printer.

A demand for a higher definition organic electroluminescent (EL) display device has been particularly increasing, and a system using an organic white-light-emitting element and a color filter (hereinafter referred to as "white+CF system") has been attracting attention (Non Patent Literature 1). The "white+CF system" enables solid vapor deposition of an organic film on an entire surface of a substrate without using an extra-fine metal mask, and thus, a higher yield can be expected compared with that of the system of discrete pixelation using a mask. Further, the use of a color filter enables reductions in a pixel size and an inter-pixel pitch to a limit of photolithography, to thereby comparatively easily attain a higher definition.

Further, in the "white+CF system", a tandem element is often used from the viewpoint of durability, and a tandem element is also used in Non Patent Literature 1. A tandem element generally has a structure in which a plurality of organic EL units are stacked between a cathode and an anode via a charge generation layer. Therefore, the tandem element has excellent characteristics that a current per element can be reduced to reduce the rate of drive degradation.

CITATION LIST

Patent Literature

PTL 1: Japanese Patent Application Laid-Open No. 2013-179248

Non Patent Literature

NPL 1: Chang-Wook Han et. al. SID2012 DIGEST 279

SUMMARY OF INVENTION

Technical Problem

However, the "white+CF system" often has a problem of lowered luminance due to the color filter. Therefore, realization of a highly efficient organic white-light-emitting element that can reduce power consumption is desired.

A mainstream way of improving emission efficiency of an organic light-emitting element is to use a microcavity system. The microcavity system is a system that can eliminate the need for an uneven structure such as a microlens, and thus, is suitable for a display device from the viewpoint of outside light reflecting characteristics. Light-emitting molecules have the property of emitting intense light toward space in which "enhancing interference" of light occurs. Specifically, an emission speed of exciton can be increased using optical interference to control an emission pattern. In the microcavity system, device parameters (such as a thickness and a refractive index) are designed so that "enhancing interference" occurs in a direction of extracting light when seen from the light-emitting molecule. It is known that, in particular, when a distance d between a reflecting surface of the metal reflecting layer and a light emission position of the emission layer satisfies a condition: $d = i\lambda/(4n)$ ($i=1, 3, 5, \ldots$), the emission intensity is most enhanced by the interference effect. Symbol i represents an order of interference, symbol $\lambda$ represents a peak wavelength of a PL spectrum of a light-emitting molecule in a vacuum, and symbol n represents an effective refractive index between a light emission point and the metal reflecting layer. Ordinarily, in an organic white-light-emitting element, a plurality of emission layers are disposed in accordance with a wavelength of light emitted therefrom so that each of the emission layers satisfies the condition described above.

Incidentally, in a tandem-type element, every color of emitted light has a different order of interference, and thus, viewing angle characteristics often become a problem. This is because, as the order of interference becomes higher (as the distance d between the reflecting surface and the light emission position becomes larger), luminous intensity distribution characteristics are degraded (color difference and emission intensity difference between a front side and a wide-angle side become larger). This problem arises from a fact that, as the order of interference becomes higher, a change in optical distance d with respect to a change in angle becomes larger. Further, the tendency becomes more remarkable as interference intensity is increased. Therefore, a tandem white-light-emitting element has a tendency that, when the interference intensity is increased for the purpose of improving the emission efficiency, the viewing angle characteristics are remarkably degraded. Specifically, there is a problem in that a tradeoff relationship between the emission efficiency and the viewing angle characteristics is stronger than that in other structures.

The present invention is directed to providing an organic light-emitting element for emitting white light, which has both a reduced power consumption and improved viewing angle characteristics, and various kinds of apparatuses and devices that use the organic light-emitting element.

Solution to Problem

Specifically, according to one aspect of the present invention, there is provided an organic light-emitting element for emitting white light, including, in the stated order:
a first electrode;
a first emission layer;
a second emission layer; and
a second electrode,
the first electrode being a light extraction electrode,
the second electrode being a reflective electrode,
the first emission layer being an emission layer for emitting blue light,
in which an optical distance $L_1$ between the first emission layer and the second electrode satisfies Expression (a), and an optical distance $L_2$ between the second emission layer and the second electrode satisfies Expression (b):

$$(\lambda_1/8) \times (3-(2\varphi_1/\pi)) < L_1 < (\lambda_1/8) \times (5-(2\varphi_1/\pi)) \quad \text{(a); and}$$

$$(\lambda_2/8) \times (-(2\varphi_2/\pi)-1) < L_2 < (\lambda_2/8) \times (-(2\varphi_2/\pi)+1) \quad \text{(b),}$$

where $\lambda_1$ is a maximum peak wavelength of light emitted from a light-emitting material included in the first emission layer, $\lambda_2$ is a maximum peak wavelength of light emitted from a light-emitting material included in the second emission layer, $\varphi_1$ is a phase shift at a time when light of the wavelength $\lambda_1$ is reflected by the second electrode, and $\varphi_2$ is a phase shift at a time when light of the wavelength $\lambda_2$ is reflected by the second electrode, and in which the organic light-emitting element further includes a first organic compound layer formed between the first electrode and the first emission layer, and a refractive index of the first organic compound layer at the wavelength $\lambda_1$ is 1.70 or less.

Further features of the present invention will become apparent from the following description of exemplary embodiments with reference to the attached drawings.

DESCRIPTION OF EMBODIMENT

Figure 1A:
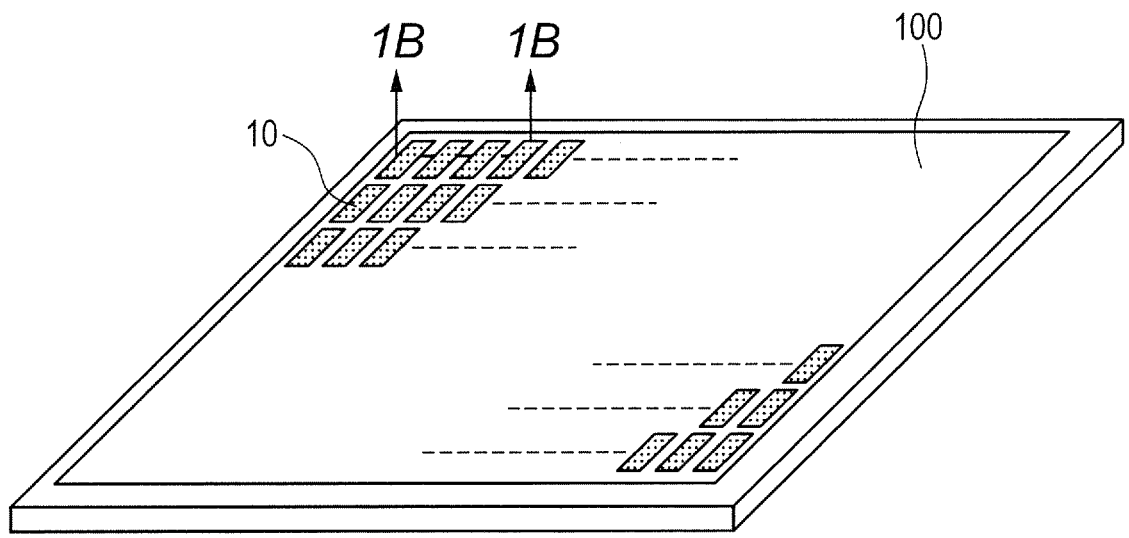
FIGS. 1A and 1B are schematic views of an exemplary display device that uses an organic light-emitting element according to the present invention.
Figure 1B:
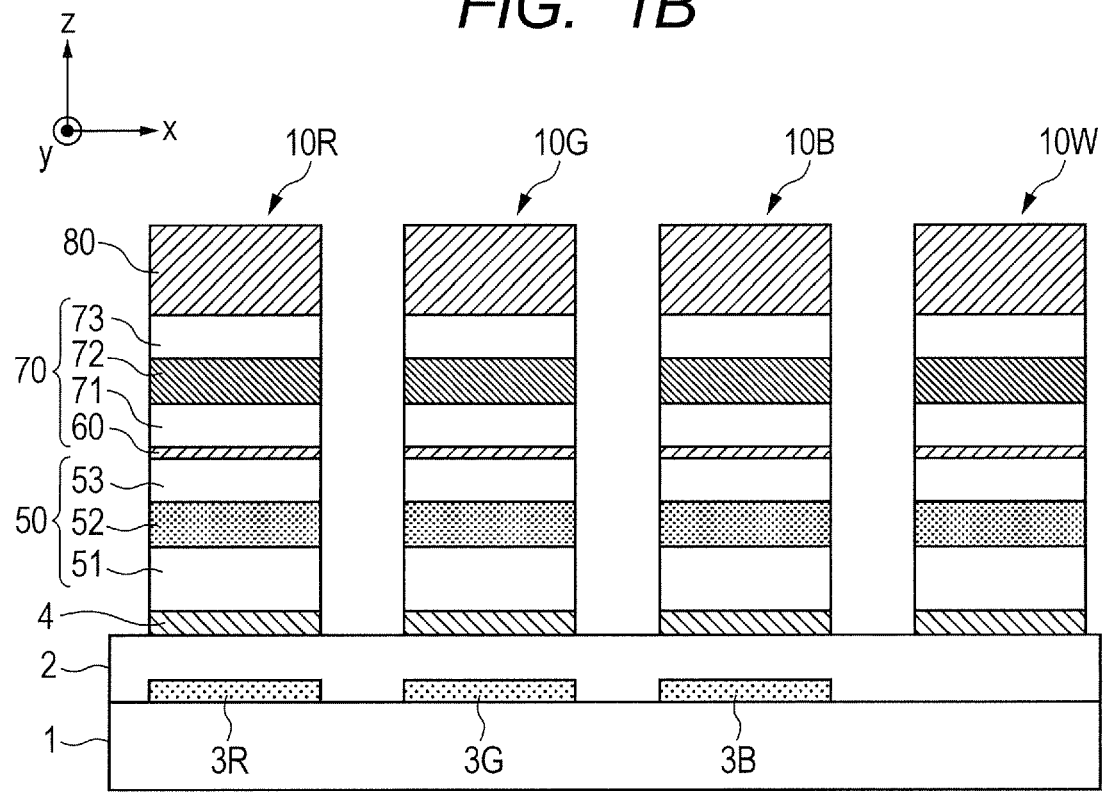

An organic light-emitting element according to the present invention is described below with reference to the attached drawings. FIGS. 1A and 1B are schematic views of an exemplary display device that uses an organic light-emitting element according to the present invention. FIG. 1A is a perspective view and FIG. 1B is a sectional view taken along the line 1B-1B in FIG. 1A.

In the display device illustrated in FIG. 1A, a plurality of subpixels 10 are arranged in a display region 100. The subpixel 10 includes an organic light-emitting element according to the present invention, and is to be a light emission point. The organic light-emitting element illustrated in FIG. 1B is a tandem organic light-emitting element of a bottom emission type that emits white light, and includes a color filter substrate 2, a light extraction electrode 4 that transmits light as a first electrode, a first emission layer 52 that emits blue light, a second emission layer 72, and a reflective electrode 80 as a second electrode in the mentioned order on a support substrate 1. The organic light-emitting element extracts light through the light extraction electrode 4.

With reference to FIG. 1B, a subpixel 10R that emits red light, a subpixel 10G that emits green light, a subpixel 10B that emits blue light, and a subpixel 10W that emits white light form one pixel. For the sake of convenience, the subpixel that emits red light, the subpixel that emits green light, the subpixel that emits blue light, and the subpixel that emits white light are hereinafter sometimes referred to as an "R subpixel", a "G subpixel", a "B subpixel" and a "W subpixel", respectively. The R subpixel 10R, the G subpixel 10G, and the B subpixel 10B include color filters 3R, 3G, and 3B, respectively, between the support substrate 1 and the light extraction electrodes 4. The color filters convert white light that is emitted from the organic light-emitting elements into light with colors of their respective pixels.

In this case, the reflective electrode 80 is a metal electrode that has a reflectivity of 70% or more at an emission wavelength. The light extraction electrode 4 is an electrode on a side of extracting light to the outside, and is formed of a transparent conductive film having a transmittance of 80% or more at the emission wavelength. It is to be noted that the emission wavelength referred to herein is a spectrum range of white light emitted from the organic light-emitting element. A material used for the reflective electrode 80 may be any metal electrode having a reflectivity of 70% or more. Metal such as Al, Ag, Mg, W, Ti, Mo, or Au, an alloy thereof, and a stacked film thereof may be used, and an optimum material may be selected as appropriate depending on a film forming process, injection characteristics, and the like. Further, as the light extraction electrode 4, a transparent conductive material such as ITO, IZO, AZO, IGZO, or 12CaO.7Al$_2$O$_3$ (C12A7) or a stacked film thereof may be used, and an optimum material may be selected as appropriate depending on the film forming process, the injection characteristics, and the like.

The organic light-emitting element illustrated in FIG. 1B has a plurality of organic compound layers sandwiched between the light extraction electrode 4 and the reflective electrode 80. Specifically, the organic light-emitting element has a first organic EL unit 50 and a second organic EL unit 70. The first organic EL unit 50 includes a first charge transport layer 51, the first emission layer 52, and a second charge transport layer 53. Similarly, the second organic EL unit 70 includes a third charge transport layer 71, the second emission layer 72, and a fourth charge transport layer 73. For example, when the first charge transport layer 51 is a hole transport layer, the third charge transport layer 71 is a hole transport layer, and the second charge transport layer 53 and the fourth charge transport layer 73 are electron transport layers. On the other hand, when the first charge transport layer 51 is an electron transport layer, the third charge transport layer 71 is an electron transport layer, and the second charge transport layer 53 and the fourth charge transport layer 73 are hole transport layers. In the organic light-emitting element illustrated in FIG. 1B, the first charge transport layer 51 is a first organic compound layer formed between the light extraction electrode 4 and the first emission layer 52. Further, the fourth charge transport layer 73 is a second organic compound layer formed between the reflective electrode 80 and the second emission layer 72. The second charge transport layer 53 and the third charge transport layer 71 are third organic compound layers formed between the first emission layer 52 and the second emission layer 72. Further, the organic light-emitting element illustrated in FIG. 1B includes a charge generation layer 60 formed between the first emission layer 52 and the second emission layer 72.

An optimum material for those charge transport layers may be selected from the viewpoint of emission efficiency, drive life, optical interference, or the like. The hole transport layer may function as an electron block layer or a hole injection layer. The electron transport layers may function as a hole block layer or an electron injection layer. Further, the charge transport layers may have, for the purpose of separating functions thereof, a stack structure of, for example, a hole injection layer and an electron block layer, or a stack structure of, for example, an electron injection layer and a hole block layer.

Further, according to the present invention, materials contained in the respective organic compound layers are not limited. For example, a light-emitting material that forms the first emission layer 52 and the second emission layer 72 may be any one of a fluorescent material and a phosphorescent material, may be doped into a host material, or may further have, in addition to the light-emitting material, at least one kind of compounds for the purpose of improving performance of the element.

Further, as the support substrate 1, there is used an inorganic film such as SiN, various kinds of glass substrates such as a high-refractive-index glass substrate, or a glass substrate or a plastic substrate having a drive circuit formed thereon including a thin film transistor (TFT) in which a semiconductor is formed of poly-Si or amorphous silicon (a-Si), In—Ga—Zn—O (IGZO), or the like.

In the display device, by setting thicknesses of the organic compound layers so that luminance in a front direction is particularly high, the color of emitted light is controlled by optical interference, and the light is emitted in the front direction with a higher efficiency. More specifically, through the setting of the order of interference i so that a distance $d_0$ from the light emission position of the first emission layer 52 or the second emission layer 72 to the reflecting surface of the reflective electrode 80 satisfies $d_0 = i\lambda/4n_0$ (i=1, 3, 5, . . . ) a component in the front direction increases in an emission distribution from the first emission layer 52 or the second emission layer 72 to improve luminance on the front side. It is to be noted that $n_0$ is an effective refractive index of the layers from the light emission position to the reflecting surface, and X is a maximum peak wavelength of light emitted from the first emission layer 52 or the second emission layer 72.

Further, accurately taking into consideration a phase shift at the time when light having the wavelength $\lambda$ is reflected by the reflecting surface, an optical distance L from the light emission position to the reflecting surface of the reflective electrode 80 is expressed by Expression (1), provided that the phase shift at the time when light having the wavelength $\lambda$ is reflected by the reflecting surface is $\varphi$[rad]. It is to be noted that the optical distance L is a sum total of the products of refractive indices $n_j$ and thicknesses $d_1$ of the respective organic compound layers. Specifically, L is expressed as $\Sigma n_j \times d_j$, and is also expressed as $n_0 \times d_0$. It is to be noted that $\varphi$ is a negative value.

$$L = (2m - (\varphi/\pi)) \times (\lambda/4) \quad (1)$$

In Expression (1), m is an integer that is equal to or larger than 0. It is to be noted that when $\varphi = -\pi$, if m=0 then $L=\lambda/4$, and if m=1 then $L=3\lambda/4$. For the sake of convenience, the condition m=0 in Expression (1) is hereinafter referred to as "interference condition of $3\lambda/4$" and the condition m=1 in Expression (1) is hereinafter referred to as "interference condition of $3\lambda/4$".

In this case, in an actual organic light-emitting element, taking into consideration viewing angle characteristics that are in a tradeoff relationship with extraction efficiency on the front side, it is not necessarily required that the above-mentioned thickness be strictly attained. Specifically, it is enough that the optical distance L is in a range of $\pm\lambda/8$ from the value that satisfies Expression (1). Therefore, in the organic light-emitting element according to the present invention, it is preferred that Expression (2) be satisfied. It is further preferred that the optical distance L be in a range of $\pm\lambda/16$ from the value that satisfies Expression (1), and it is preferred that Expression (2') be satisfied.

$$(\lambda/8) \times (4m - (2\varphi/\pi) - 1) < L < (\lambda/8) \times (4m - (2\varphi/\pi) + 1) \quad (2)$$

$$(\lambda/16) \times (8m - (4\varphi/\pi) - 1) < L < (\lambda/16) \times (8m - (4\varphi/\pi) + 1) \quad (2')$$

In the organic light-emitting element according to the present invention, in order to emit white light with high emission efficiency, it is preferred that an optical distance $L_1$ between the first emission layer 52 and the reflective electrode 80 and an optical distance $L_2$ between the second emission layer 72 and the reflective electrode 80 satisfy the interference condition of $3\lambda/4$ and the interference condition of $\lambda/4$, respectively.

Therefore, it is preferred that the optical distance $L_1$ satisfy Expression (a) and further Expression (a'):

$$(\lambda_1/8) \times (3 - (2\varphi_1/\pi)) < L_1 < (\lambda_1/8) \times (5 - (2\varphi_1/\pi)) \quad (a)$$

$$(\lambda_1/16) \times (7 - (4\varphi_1/\pi)) < L_1 < (\lambda_1/16) \times (9 - (4\varphi_1/\pi)), \quad (a')$$

where $\lambda_1$ is a maximum peak wavelength of light emitted from the light-emitting material of the first emission layer 52, and $\varphi_1$ is a phase shift at the time when light having the wavelength $\lambda_1$ is reflected by the reflective electrode 80.

Further, it is preferred that the optical distance $L_2$ satisfy Expression (b) and further Expression (b'):

$$(\lambda_2/8) \times (-1 - (2\varphi_2/\pi)) < L_2 < (\lambda_2/8) \times (1 - (2\varphi_2/\pi)) \quad (b)$$

$$(\lambda_2/16) \times (-1 - (4\varphi_2/\pi)) < L_2 < (\lambda_2/16) \times (1 - (4\varphi_2/\pi)) \quad (b')$$

where $\lambda_2$ is a maximum peak wavelength of light emitted from the light-emitting material of the second emission layer 72, and $\varphi_2$ is a phase shift at the time when light having the wavelength $\lambda_2$ is reflected by the reflective electrode 80.

According to the present invention, the first emission layer 52 is an emission layer that emits blue light, and the second emission layer 72 is an emission layer that emits visible light having a wavelength that is longer than that of blue light. It is preferred that the second emission layer 72 include two kinds of light-emitting materials, and it is further preferred that the light-emitting materials of the second emission layer 72 be a light-emitting material that emits red light and a light-emitting material that emits green light. Further, from the viewpoint of power consumption, it is preferred that the wavelength $\lambda_2$ be a maximum peak wavelength of light that is emitted from any one of the two kinds of light-emitting materials or a maximum peak wavelength of light obtained by mixing light beams that are emitted from the two kinds of light-emitting materials.

In general, as the order of interference becomes higher (as the distance L between the reflecting surface and the light emission position becomes larger), color difference and emission intensity difference between the front side and the wide-angle side becomes larger. Further, the tendency becomes more remarkable as interference intensity is increased. Therefore, in a tandem structure in which different interference conditions, i.e., the interference condition of $3\lambda/4$ and the interference condition of $\lambda/4$, are used for the optical distance $L_1$ and the optical distance $L_2$, there is a clear tradeoff relationship between the viewing angle characteristics and the power consumption. According to the present invention, in a tandem organic white-light-emitting element in which the first emission layer 52 is an emission layer that emits blue light, it is found that both the viewing angle characteristics and the power consumption can be improved through the setting of the refractive index of the first organic compound layer (first charge transport layer 51) formed between the light extraction electrode 4 and the first emission layer 52 to be 1.70 or less at the wavelength $\lambda_1$.

In the organic light-emitting element according to the present invention, it is preferred that the refractive indices of the second organic compound layer (fourth charge transport layer 73) and the third organic compound layers (second charge transport layer 53 and third charge transport layer 71) be 1.70 or less at the wavelength $\lambda_1$. An organic compound layer having a refractive index of 1.70 or less at the wavelength $\lambda_1$ is hereinafter sometimes referred to as a "low refractive index layer". Further, it is preferred that the refractive index of the light extraction electrode 4 at the wavelength $\lambda_1$ be 2.2 or less. Further, it is preferred that the refractive index of the first emission layer 52 at the wavelength $\lambda_1$ be in a range of from 1.8 to 2.1.

Further, the organic light-emitting element according to the present invention may have a structure in which a non-interfering layer is formed on a light extraction side of the light extraction electrode 4. In this case, it is preferred that the refractive index of the non-interfering layer at the wavelength $\lambda_1$ be 1.65 or less. The non-interfering layer may be formed of an organic material or an inorganic material insofar as the material has the above-mentioned refractive index.

<Display Device, Image Information Processing Apparatus, Lighting Apparatus, Image Forming Apparatus, and Exposure Device>

The organic light-emitting element according to the present invention is used in a display device, an image information processing apparatus, a lighting apparatus, an image forming apparatus, an exposure device, or the like.

As illustrated in FIGS. 1A and 1B, the display device according to the present invention includes a plurality of light emission points (subpixels 10). The light emission point includes the organic light-emitting element of the present invention. Further, it is preferred that the display device according to the present invention include the color filters 3R, 3G, and 3B on the light extraction side.

An image information processing apparatus according to the present invention includes an input unit for inputting image information, and a display unit for displaying the image information. The display unit is the display device of the present invention.

A lighting apparatus according to one embodiment of the present invention includes the organic light-emitting element of the present invention, and a circuit for supplying a drive current to the organic light-emitting element. A lighting apparatus according to another embodiment of the present invention includes the organic light-emitting element of the present invention, and a heat dissipation member.

Figure 2:
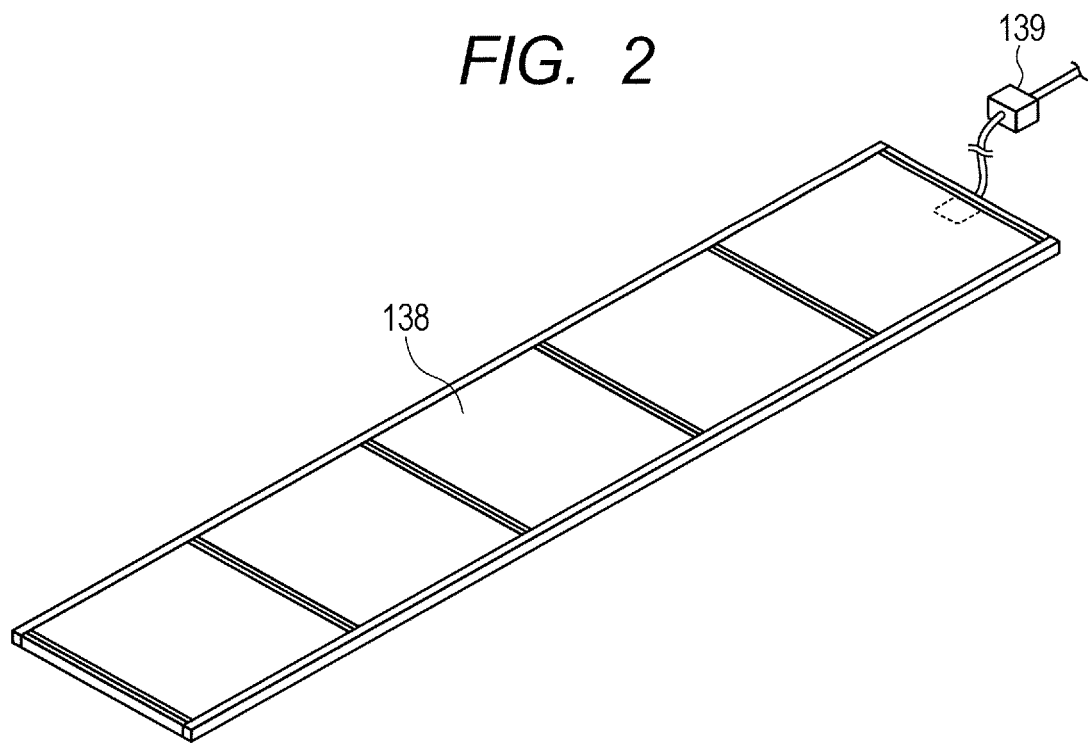
FIG. 2 is a schematic view of a lighting apparatus according to the present invention.

FIG. 2 is a schematic view illustrating a lighting apparatus according to the present invention. The lighting apparatus includes a substrate, an organic light-emitting element 138, and an AC-to-DC converter circuit 139. The lighting apparatus may further include a heat dissipation member such as a heat dissipating plate (not shown) on, for example, a rear surface side with respect to a substrate surface on which the organic light-emitting element 138 is mounted.

An image forming apparatus according to the present invention is an electrophotographic image forming apparatus including a photosensitive member, a charging unit for charging the photosensitive member, an exposure unit for exposing the photosensitive member, and a developing unit for supplying the photosensitive member with developer, to thereby develop an electrostatic latent image formed on the photosensitive member. The exposure unit includes the organic light-emitting element of the present invention, and the organic light-emitting elements are arranged, for example, in a line along a long axis direction of the photosensitive member.

Figure 3:
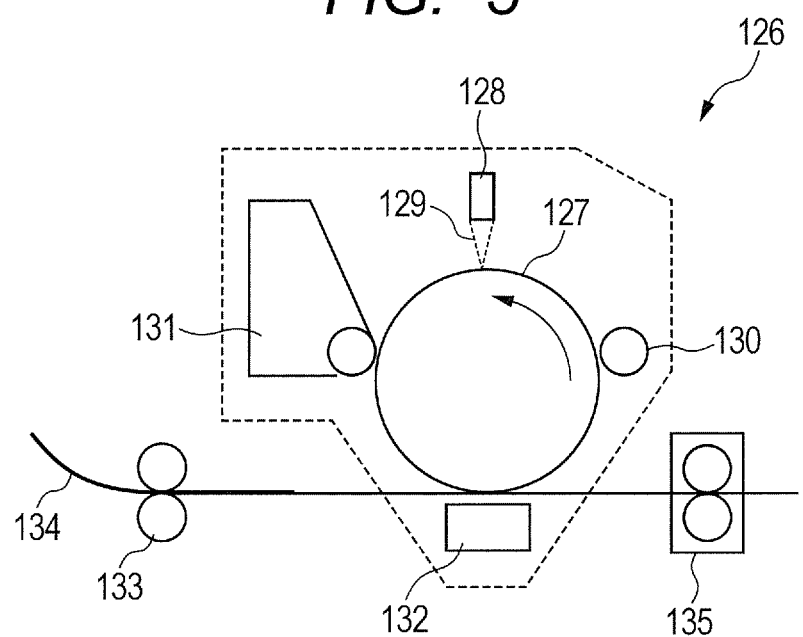
FIG. 3 is a schematic view of an image forming apparatus according to the present invention.

FIG. 3 is a schematic view of an image forming apparatus 126 according to the present invention. The image forming apparatus 126 includes a photosensitive member 127, an exposure unit 128, a charging unit 130, a developing unit 131, a transfer unit 132, conveying rollers 133, and a fixing unit 135. Light 129 is emitted from the exposure unit 128, and an electrostatic latent image is formed on a surface of the photosensitive member 127. The exposure unit 128 includes the organic light-emitting element according to the present invention. The developing unit 131 includes toner and the like. The charging unit 130 charges the photosensitive member 127. The transfer unit 132 transfers a developed image onto a recording medium 134. The conveying rollers 133 convey the recording medium 134. The recording medium 134 is, for example, paper. The fixing unit 135 fixes the image formed on the recording medium 134.

The exposure device according to the present invention is arranged in the electrophotographic image forming apparatus that includes the photosensitive member, the charging unit for charging the photosensitive member, and the developing unit for developing an electrostatic latent image formed on the photosensitive member, and is an exposure device for exposing the photosensitive member. The exposure device includes the organic light-emitting element of the present invention, and the organic light-emitting elements are arranged in a line along a long axis direction of the photosensitive member.

Figure 4A:
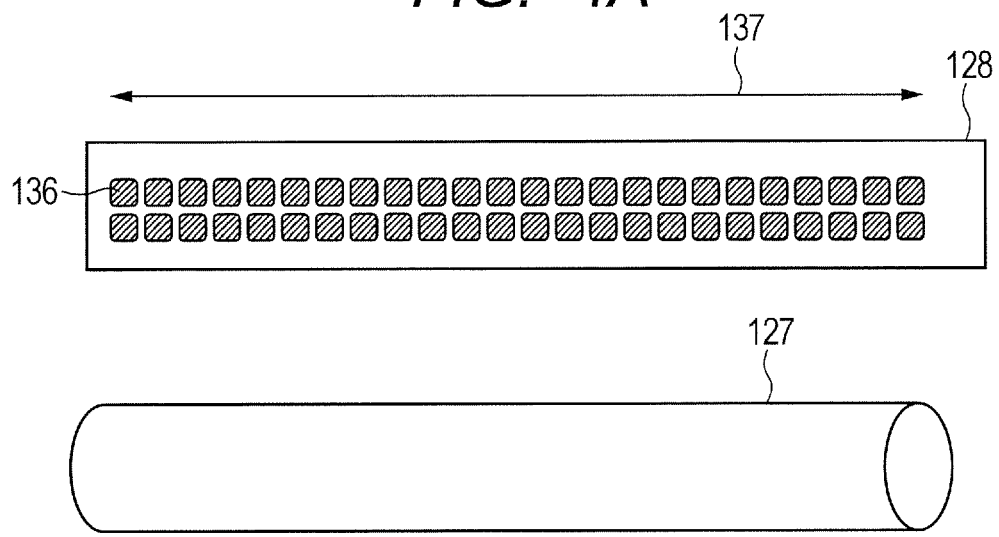
FIGS. 4A and 4B are schematic views of an exposure device according to the present invention.
Figure 4B:
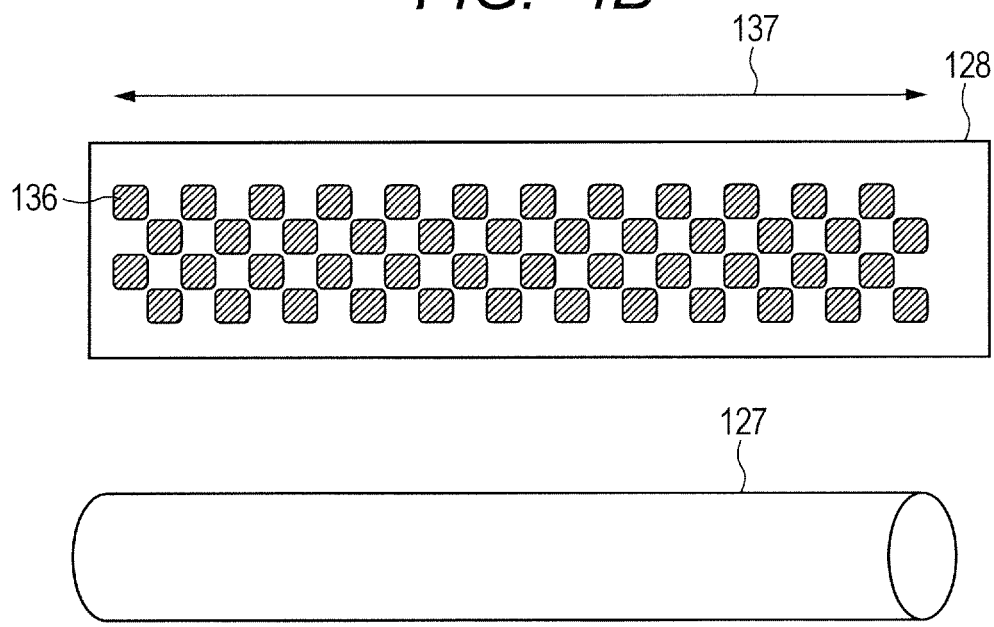

FIGS. 4A and 4B are schematic views of the exposure device according to the present invention. A plurality of light emission portions 136 are arranged on a long substrate in the exposure device 128. The light emission portion 136 includes the organic light-emitting element of the present invention. An arrow 137 shows a column direction along which the organic light-emitting elements are arranged. The column direction is a direction of an axis of the photosensitive member 127 that rotates. In FIG. 4A, the light emission portions 136 are arranged along the long axis direction of the photosensitive member 127. In FIG. 4B, the light emission portions 136 are arranged differently from those illustrated in FIG. 4A, in a staggered arrangement in a first line and a second line in the column direction. Places in which the light emission portions 136 are arranged are different in the first line and in the second line in a row direction. In the first line, a plurality of light emission portions 136 are spaced apart from one another. In the second line, the light emission portions 136 are arranged at places corresponding to the spaces between the light emission portions 136 in the first line. Specifically, the plurality of light emission portions 136 are spaced apart from one another also in a row direction. The arrangement illustrated in FIG. 4B may also be referred to as a lattice arrangement, a staggered arrangement, or checkers.

The organic light-emitting element according to the present invention may be, for the purpose of controlling light emission thereof, connected to an active element, for example, a switching element such as a transistor, and it is preferred that the active element include an oxide semiconductor formed in an active layer thereof. An oxide semiconductor portion of the active element may be an amorphous material, a crystalline material, or a mixture thereof. When the oxide semiconductor portion is a crystal, the crystal may be any one of a single crystal, a micro crystal, or a crystal in which a specified axis such as a c-axis is oriented, or a mixture of at least any two thereof.

EXAMPLE

In the following, a description is given of results of analysis of a refractive index of the first organic compound layer (first charge transport layer 51) and display device characteristics (relationship between power consumption and viewing angle characteristics) in the element structure illustrated in FIG. 1B.

<Calculation Conditions of Analysis>

First, calculation conditions used in the analysis are described.

Figure 5:
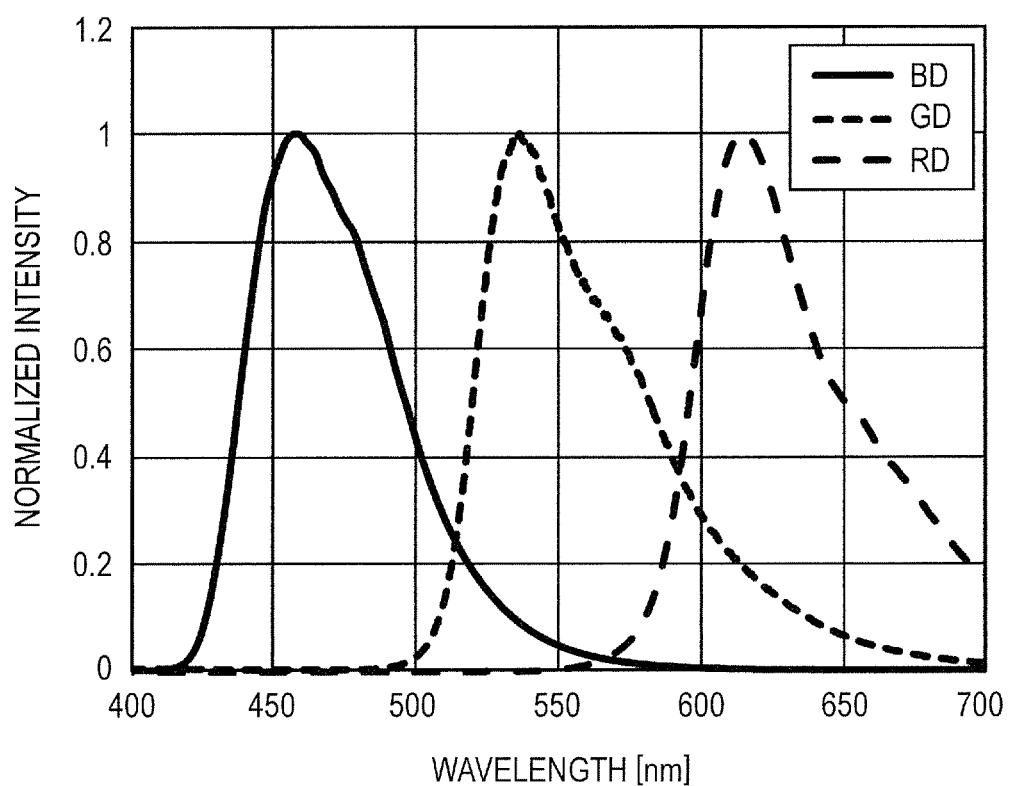
FIG. 5 is a graph showing spectra of light-emitting materials used in analysis.
Figure 6:
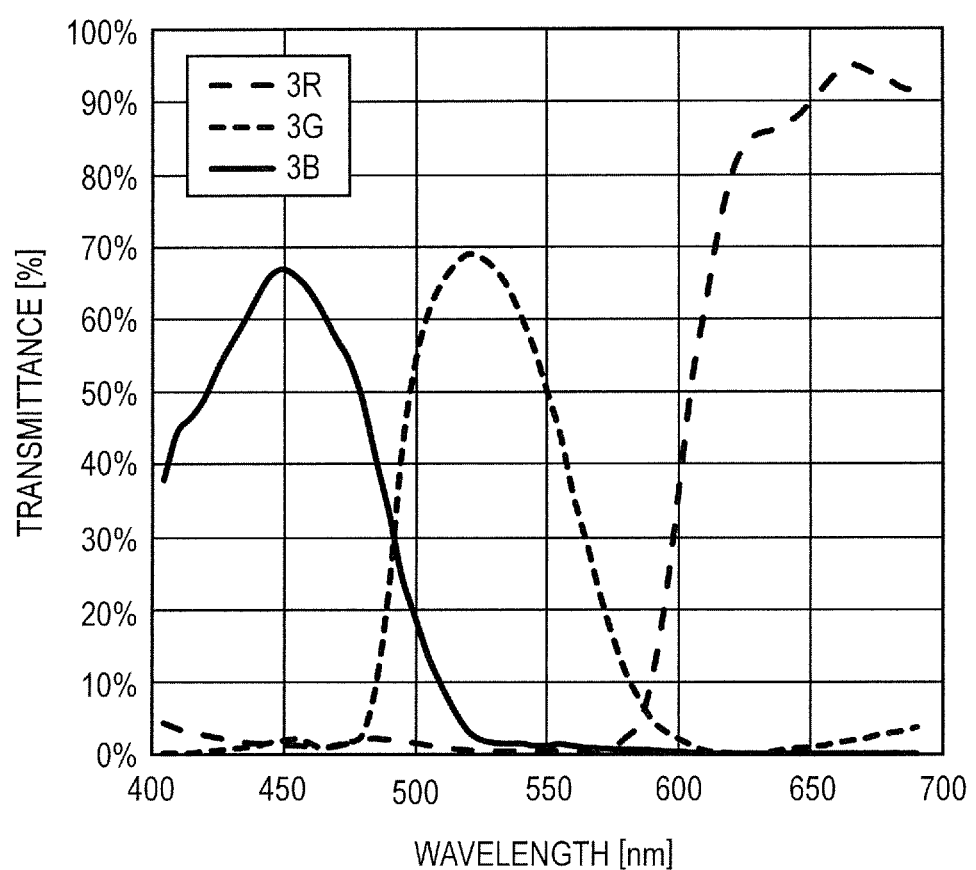
FIG. 6 is a graph showing transmittance of color filters used in the analysis.

FIG. 5 shows PL spectra of a light-emitting material that emits red light, a light-emitting material that emits green light, and a light-emitting material that emits blue light used in the analysis. The PL spectra are normalized to a maximum peak value. For the sake of convenience, the light-emitting material that emits red light, the light-emitting material that emits green light, and the light-emitting material that emits blue light are sometimes referred to as "RD", "GD", and "BD", respectively. FIG. 6 shows transmittance of the color filters 3R, 3G, and 3B used in the analysis. The light-emitting materials and the color filters are not limited to the ones shown in FIGS. 5 and 6, and there may be used any combination with which the display device characteristics such as a gamut can be optimized.

Figure 7:
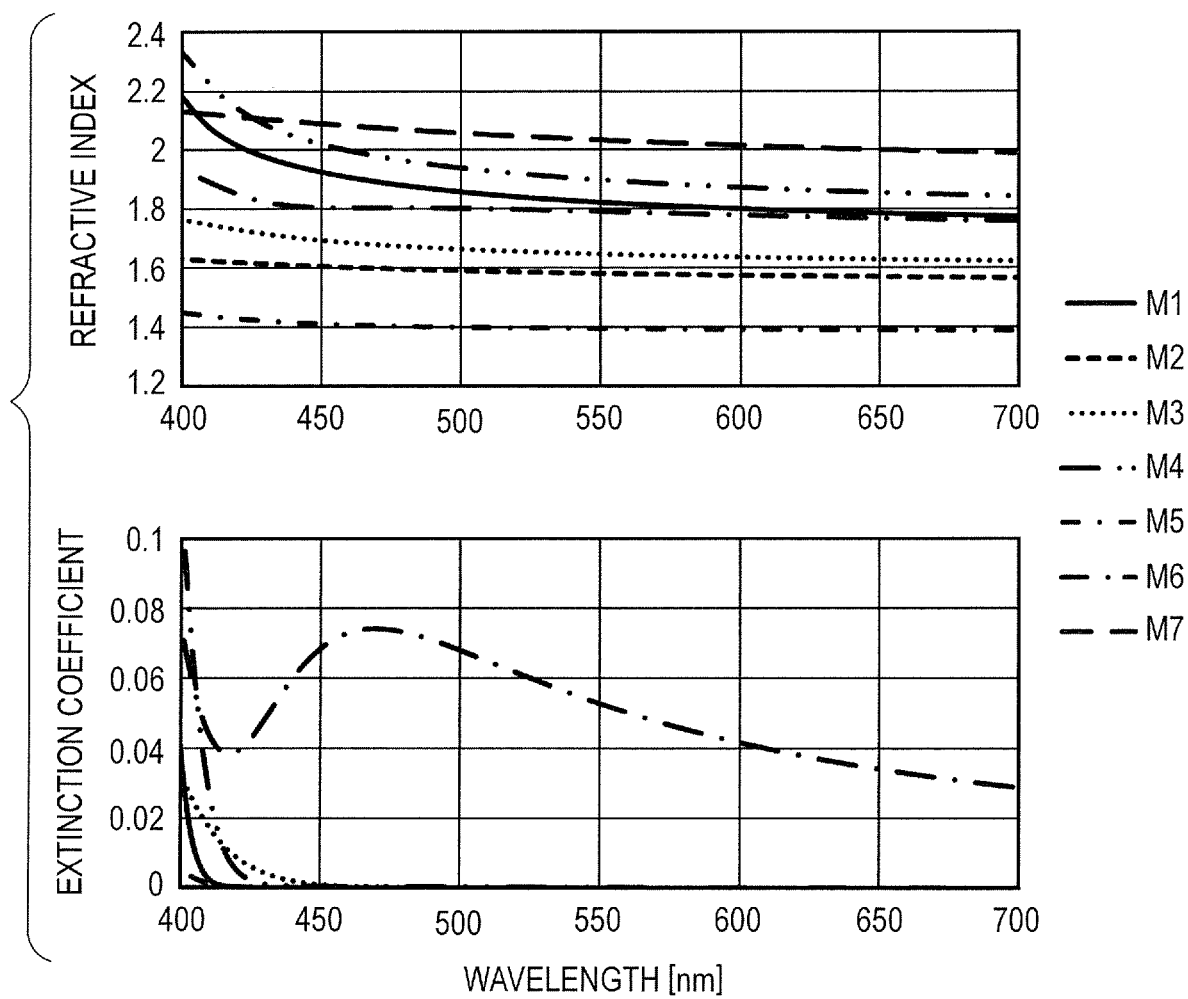
FIG. 7 is a graph showing optical characteristics of materials used in the analysis.

FIG. 7 shows optical characteristics (refractive indices and extinction coefficients) of materials M1 to M5 used for hosts of the emission layers 52 and 72 and the charge transport layers 51, 53, 71, and 73. It is to be noted that FIG. 7 also shows optical characteristics of materials M6 and M7 used for the charge generation layer 60 to be described below. As the refractive indices of the materials, it is desired to adopt refractive indices in a blue region in which dispersion characteristics are conspicuous. In the present study, as refractive indices at the wavelength $\lambda_1$, values at a maximum peak wavelength $\lambda=455$ nm of BD shown in FIG. 5 is adopted. The materials M2, M3, and M5 are materials having refractive indices of 1.70 or less at the wavelength $\lambda_1$. A material having the refractive index of 1.70 or less at the wavelength $\lambda_1$ is hereinafter sometimes referred to as a "low refractive index material". It is to be noted that it is desired that an extinction coefficient of a low refractive index layer according to the present invention in a wavelength region used be 0.02 or less. This is because light absorption in the element due to multiple interference increases to lower the power consumption. Further, insofar as the refractive index of a low refractive index layer is 1.70 or less at the wavelength $\lambda_1$, the low refractive index layer may be formed only of a low refractive index material, or, for example, may be formed by doping a hole transport material or an electron transport material with a low refractive index material. It is to be noted that the optical characteristics of the materials can be measured with a commercially available spectroscopic ellipsometer using well-known ellipsometry, which is a method for determining an optical constant of a substance through observing a change in polarization state when light is reflected by a surface of the substance. It is to be noted that as a low refractive index material, a material that has dielectric anisotropy and that has the refractive index of 1.70 or less at the wavelength $\lambda_1$ in a direction within a surface of the substrate may also be selected.

In the present study, multi-objective optimization calculation was performed under a state in which thicknesses of the light extraction electrode 4 and of the charge transport layers 51, 53, 71, and 73 and an exciton generation ratio γ of GD are variables. Table 1 shows the thicknesses of the light extraction electrode 4 and of the charge transport layers 51, 53, 71, and 73 and a lower limit value and an upper limit value of the exciton generation ratio γ of GD.

TABLE 1

|  | Lower limit | Upper limit |
| --- | --- | --- |
| Light extraction electrode thickness [nm] | 20 | 190 |
| First charge transport layer thickness [nm] | 5 | 100 |
| Second charge transport layer thickness [nm] | 10 | 100 |
| Third charge transport layer thickness [nm] | 10 | 100 |
| Fourth charge transport layer thickness [nm] | 5 | 80 |
| Exciton generation ratio γ of GD | 0.2 | 0.75 |

Thicknesses of the first emission layer 52 and the second emission layer 72 were fixed to 20 nm. With regard to the light-emitting material, one of the first emission layer 52 and the second emission layer 72 was doped only with BD, and the other was mixedly doped with GD and RD (hereinafter sometimes referred to as "GD+RD"). The carrier balance factor was assumed 1, and exciton generation efficiencies of BD and GD+RD were assumed 0.4 and 1, respectively. In other words, when the exciton generation ratio of GD is γ, the exciton generation ratio of RD is 1-γ. Further, light emission yields in bulk of BD, GD, and RD were assumed to be 0.82, 0.82, and 0.71, respectively. In this case, the light emission yield in bulk is the light emission yield of the light-emitting material when no optical interference exists. In an optical simulation, the dipole model proposed by Chance, Prock, and Silbey (CPS) et al. (see Expression (2) in Nowy et. al., Journal of Applied Physics 104, 123109 (2008)) was used. It is to be noted that the emission layers 52 and 72 were formed by doping the host material with a light-emitting dopant, and were assumed to have a refractive index that equals to a refractive index of the material used as the host.

The charge generation layer 60 was assumed to be a stacked film of a Cs-doped electron injection layer and $MoO_3$, and the calculation was performed on the assumption that both had a thickness of 5 nm. Optical characteristics of the Cs-doped layer and of $MoO_3$ were shown as M6 and M7, respectively, in FIG. 7. An effect of the present invention is not influenced by the material of the charge generation layer 60, and an optimum material may be selected as appropriate depending on the film forming process, the injection characteristics, and the like.

In the present analysis, a bottom emission type illustrated in FIG. 1B is assumed, and the calculation was performed on the assumption that a layer in contact with the light extraction side of the light extraction electrode 4 was a non-interfering layer (incoherent layer) having a refractive index of 1.45 at the wavelength $\lambda_1$. Further, it was assumed that the light extraction electrode 4 was ITO and the reflective electrode 80 was Al.

A multi-objective optimization algorithm was run using NESA+, and the optimization calculation was performed so that the power consumption and the viewing angle characteristics were at the minimum. Further, conditions under which experiments were successful are shown in Table 2. The values show light emission characteristics in the front direction. Further, the viewing angle characteristics (δu'v') are maximum values of chromaticity change at an angle that is 60° from a direction of a normal to the substrate. A graph showing the relationship between the power consumption and the viewing angle characteristics as a result of the analysis shows Pareto optimal solution formed of successful experiment values.

TABLE 2

|  | Lower limit | Upper limit |
| --- | --- | --- |
| gamut (sRGB) [%] | 105 | — |
| Chromaticity of B pixel CIE_y | — | 0.07 |
| Chromaticity of G pixel CIE_x | 0.18 | 0.31 |
| Chromaticity of R pixel CIE_x | 0.635 | — |

Table 3 shows specifications of the display device that are preconditions for calculating the power consumption in the present analysis. An aperture ratio of the pixel was 25%, and all the aperture ratios of R, G, B, and W subpixels 10 were 6.25%. In the present analysis, electric power necessary for the display device specified in Table 3 to emit white light of CIE Yxy (x,y)=(0.313, 0.329) having luminance of 250 cd/cm² was calculated. Specifically, the chromaticity and the emission efficiency of W were determined, and necessary currents of R, G, B, and W were calculated. In the present analysis, a drive voltage was assumed to be 13.5 V, and the power consumption was calculated from the necessary current values.

TABLE 3

| Diagonal line in inch | 3 inch |
| --- | --- |
| Vertical line ratio | 3 |
| Horizontal line ratio | 4 |
| Subpixel aperture ratio | 6.25% |
| Pixel aperture ratio | 25% |
| Circularly polarizing plate transmittance | 45% |
| Target chromaticity of white-light emission CIE_x | 0.313 |
| CIE_y | 0.329 |
| Luminance of white-light emission | 250 cd/m² |
| Drive voltage (fixed) | 13.5 V |

<Result of Analysis>

[Effect of Forming First Charge Transport Layer 51 as Low Refractive Index Layer]

Figure 8:
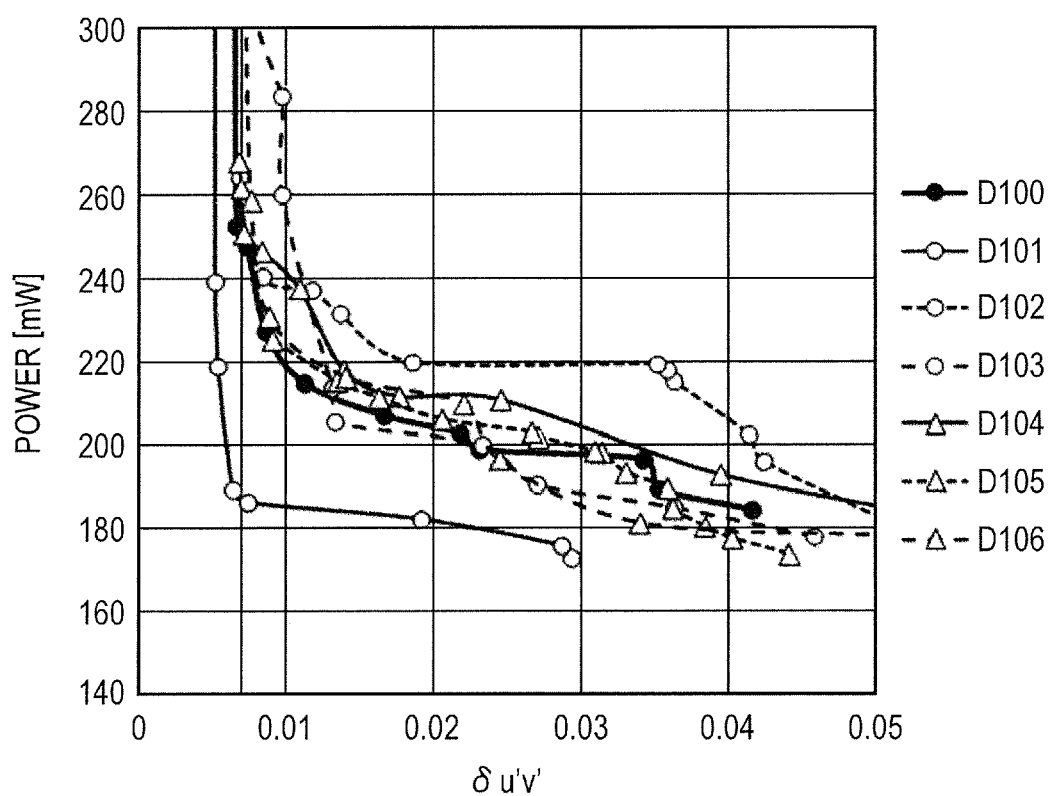
FIG. 8 is a graph showing a relationship between power consumption and viewing angle characteristics.

FIG. 8 shows a relationship between the power consumption and the viewing angle characteristics (δu'v') of elements shown in Table 4.

TABLE 4

| Element | | First charge transport layer | First emission layer Dopant | First emission layer Host | Second charge transport layer | Third charge transport layer | Second emission layer Dopant | Second emission layer Host | Fourth charge transport layer |
|---|---|---|---|---|---|---|---|---|---|
| D100 | Comparative example | M1 | BD | M1 | M1 | M1 | RD + GD | M1 | M1 |
| D101 | Example | M2 | BD | M1 | M1 | M1 | RD + GD | M1 | M1 |
| D102 | Comparative example | M1 | BD | M2 | M1 | M1 | RD + GD | M1 | M1 |
| D103 | Comparative example | M1 | BD | M1 | M2 | M1 | RD + GD | M1 | M1 |
| D104 | Comparative example | M1 | BD | M1 | M1 | M2 | RD + GD | M1 | M1 |
| D105 | Comparative example | M1 | BD | M1 | M1 | M1 | RD + GD | M2 | M1 |
| D106 | Comparative example | M1 | BD | M1 | M1 | M1 | RD + GD | M1 | M2 |

In the elements shown in Table 4, the first emission layer 52 is doped only with BD, and the second emission layer 72 is mixedly doped with GD and RD. In the element D100, all the emission layers 52 and 72 and the charge transport layers 51, 53, 71, and 73 are formed of the material M1. In the elements D101 to D106, any one of the layers is formed of the material M2 that is a low refractive index material, and the other layers are formed of the material M1. Therefore, the element D101 in which the first charge transport layer 51 is formed of the material M2 is Example of the present invention, and the other elements are Comparative Examples.

As shown in FIG. 8, in the element D100 as Comparative Example, the power consumption was about 190 mW in a region with poor viewing angle characteristics (δu'v' is 0.04-0.05), and, as the value of δu'v' became smaller, the power consumption increased to reach about 250 mW when δu'v' was 0.007. As described above, it can be understood that there is a clear tradeoff relationship between the power consumption and the viewing angle characteristics. The other Comparative Examples (elements D102 to D106) have a similar tendency. Therefore, it can be understood that no effect can be obtained by forming only the layers other than the first charge transport layer 51 of the material M2. On the other hand, in the element D101 as Example, even in a region with the viewing angle characteristics δu'v' of 0.02 or less, increase in power consumption is small, and the tradeoff relationship between the power consumption and the viewing angle characteristics is weak. When δu'v'=0.007, the power consumptions of the element D100 and the element D101 were 250 mW and 187 mW, respectively, and the power consumptions reduced by about 25%.

In the above, it is described that, by forming the first charge transport layer 51 to be a low refractive index layer, the tradeoff relationship between the power consumption and the viewing angle characteristics can be weakened, and that an effect of reducing the power consumption is enhanced in a region in which δu'v' is small.

[Effect of Forming First Charge Transport Layer 51 as Low Refractive Index Layer in Element in which First Emission Layer 52 is Blue-Light Emission Layer]

Next, it is shown that the effect of forming the first charge transport layer 51 as a low refractive index layer is obtained only when the first emission layer 52 satisfying the interference condition of 3λ/4 is an emission layer that emits blue light.

Figure 9:
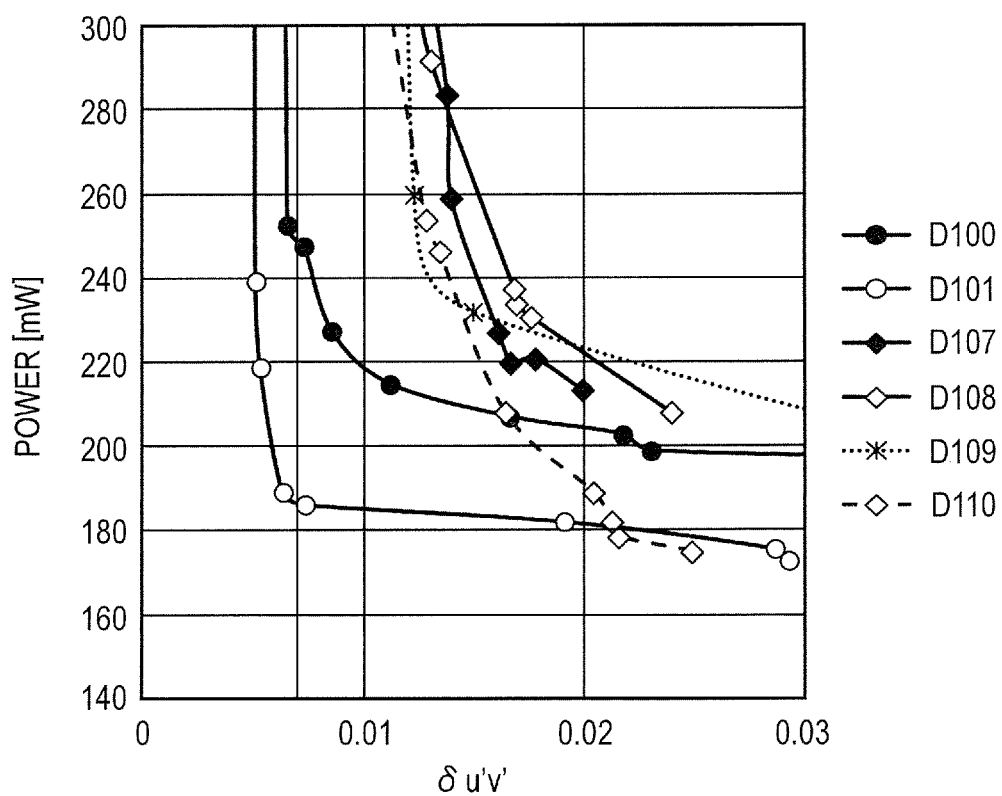
FIG. 9 is a graph showing a relationship between power consumption and viewing angle characteristics.

FIG. 9 shows a relationship between the power consumption and the viewing angle characteristics of elements shown in Table 5. FIG. 9 also shows the results of the element D100 and the element D101 for comparison purposes.

TABLE 5

| Element | | First charge transport layer | First emission layer Dopant | First emission layer Host | Second charge transport layer | Third charge transport layer | Second emission layer Dopant | Second emission layer Host | Fourth charge transport layer |
|---|---|---|---|---|---|---|---|---|---|
| D107 | Comparative example | M1 | RD + GD | M1 | M1 | M1 | BD | M1 | M1 |
| D108 | Comparative example | M2 | RD + GD | M1 | M1 | M1 | BD | M1 | M1 |
| D109 | Comparative example | M1 | RD + GD | M1 | M1 | M2 | BD | M1 | M1 |
| D110 | Comparative example | M1 | RD + GD | M1 | M1 | M1 | BD | M1 | M2 |

In the elements shown in Table 5, the first emission layer 52 is mixedly doped with GD and RD while the second emission layer 72 is doped only with BD, and all the elements are Comparative Examples. The element D107 is an element in which all the emission layers 52 and 72 and the charge transport layers 51, 53, 71, and 73 are formed of the material M1. On the other hand, in the elements D108 to D110, any one of the charge transport layers is formed of the material M2 that is a low refractive index material, and the other charge transport layers and the emission layers 52 and 72 are formed of the material M1.

The element D108 has, similarly to the element D101, the structure in which the first charge transport layer 51 is a low refractive index layer. On the other hand, the element D109 has a structure in which a layer in contact with the light extraction side of the emission layer that emits blue light (second emission layer 72) is a low refractive index layer. Further, the element D110 is an element that can inhibit surface plasmon loss of BD and that is expected to improve the emission efficiency of BD compared with the other structures. In general, it is known that, when BD satisfies the interference condition of $\lambda/4$, there is an optical loss mainly due to the surface plasmon loss and the emission efficiency of BD is lowered. As a method of inhibition thereof, a method in which a low refractive index layer is introduced between the emission layer and a reflection metal has been proposed (Patent Literature 1)

Referring to the results shown in FIG. 9, in the element D107, the power consumption abruptly increases when $\delta u'v'$ is 0.02 or less, and the rate of increase is higher than that of the element D100. In other words, it can be understood that the tradeoff relationship between the power consumption and the viewing angle characteristics is stronger than that in the element D100. When comparing the element D107 and the elements D108 to D110, in all the elements, increase in power consumption similar to the case of the element D107 was observed in a region with satisfactory viewing angle ($\delta u'v'$ is 0.015 or less). In other words, the effect of introducing the low refractive index layer was not observed.

In particular, in the element D110, in a region in which $\delta u'v'$ is more than 0.015, the effect of lowering the power consumption was observed, and the expected surface plasmon inhibition can be supposed to be attained. However, in a region with the satisfactory viewing angle characteristics (<0.015), similarly to the case of the element D107, the power consumption abruptly increased. In other words, it can be understood that, in the region with the satisfactory viewing angle characteristics, the tradeoff relationship between the power consumption and the viewing angle characteristics were similarly to that in the case of the element D107. This shows that, in an organic white-light-emitting element formed of a plurality of emission layers, balance among interferences of red light, green light, and blue light is important, and a method of improving the efficiency that is effective in a structure in which RGB are formed by separately applying the colors is not necessarily effective. Similarly, in the elements D108 and D109, the effect of introducing a low refractive index layer was not observed. From this, it can be understood that, in an element in which the second emission layer 72 that satisfies the interference condition of $\lambda/4$ is an emission layer that emits blue light, the effect of causing the first charge transport layer 51, or the layer in contact with the light extraction side of the emission layer that emits blue light (second emission layer 72) to be a low refractive index layer cannot be obtained.

In the above, there is described that both lowered power consumption and a large viewing angle can be attained only when the first emission layer 52 satisfying the interference condition of $3\lambda/4$ is an emission layer that emits blue light, and the low refractive index layer is introduced into the first charge transport layer 51.

[Place of Introducing Low Refractive Index Layer in First Charge Transport Layer 51]

Next, a place in the first charge transport layer 51 into which a low refractive index layer is introduced to obtain the effect is described.

Figure 10:
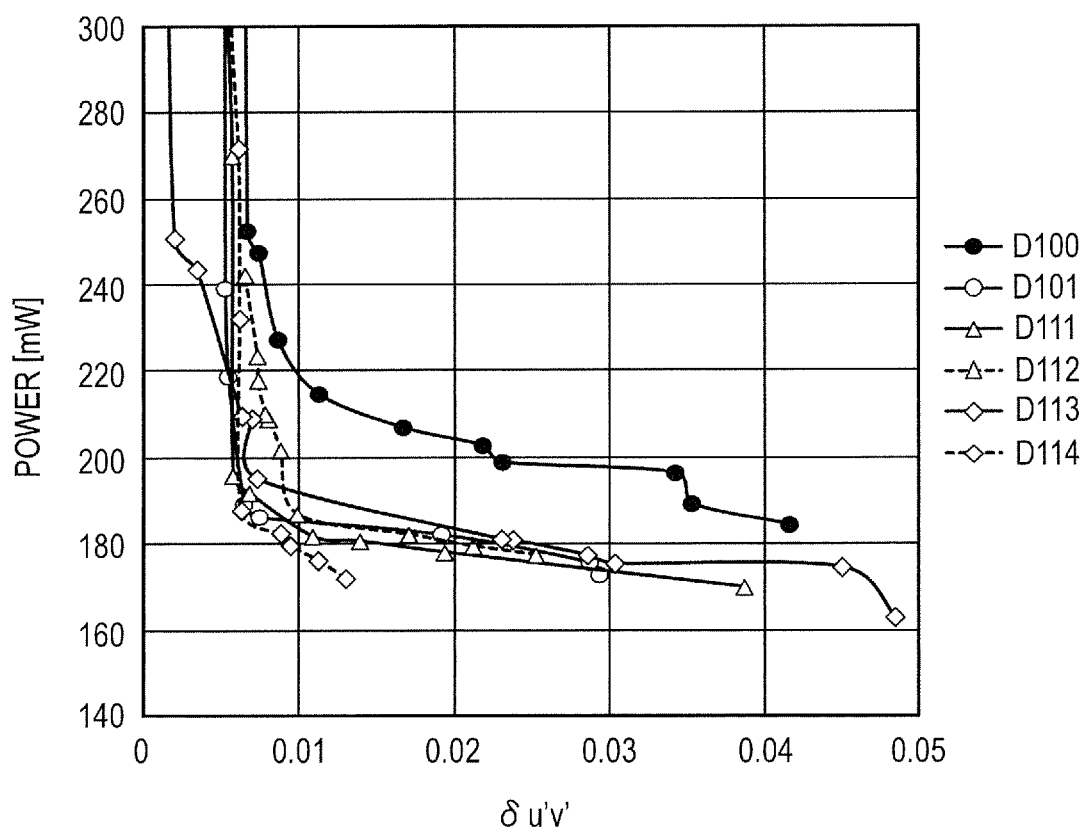
FIG. 10 is a graph showing a relationship between power consumption and viewing angle characteristics.

FIG. 10 shows a relationship between the power consumption and the viewing angle characteristics of elements shown in Table 6. FIG. 10 also shows the results of the element D100 and the element D101 for comparison purposes.

TABLE 6

| Element | | First sub charge transport layer | | Second sub charge transport layer | | First emission layer | | Second charge transport layer | Third charge transport layer | Second emission layer | | Fourth charge transport layer |
|---|---|---|---|---|---|---|---|---|---|---|---|---|
| | | Material | Thickness [nm] | Material | Thickness [nm] | Dopant | Host | layer | layer | Dopant | Host | layer |
| D111 | Example | M2 | 2-80 | M1 | 1 | BD | M1 | M1 | M1 | RD + GD | M1 | M1 |
| D112 | Example | M2 | 2-80 | M1 | 20 | BD | M1 | M1 | M1 | RD + GD | M1 | M1 |
| D113 | Example | M1 | 10 | M2 | 2-80 | BD | M1 | M1 | M1 | RD + GD | M1 | M1 |
| D114 | Example | M1 | 20 | M2 | 2-80 | BD | M1 | M1 | M1 | RD + GD | M1 | M1 |

In the elements shown in Table 6, the first emission layer 52 is doped only with BD while the second emission layer 72 is mixedly doped with GD and RD, and all the emission layers 52 and 72 and the second to fourth charge transport layers 53, 71, and 73 are formed of the material M1. The first charge transport layer 51 has a two-layer structure including a first sub charge transport layer and a second sub charge transport layer. The first sub charge transport layer is in contact with the light extraction electrode 4, and the second sub charge transport layer is in contact with the first emission layer 52. In the element D111 and the element D112, the second sub charge transport layer is formed of the material M1 and has fixed thicknesses of 10 nm and 20 nm, respectively, and the first sub charge transport layer is formed of the material M2 that is a low refractive index material. Then, optimization was performed in a range in which the first sub charge transport layer had a thickness of 2 nm to 80 nm. Further, optimization was performed in the element D113 and the element D114 in a manner that the materials and the fixed thicknesses were changed between the second sub charge transport layer and the first sub charge transport layer as shown in Table 6. All the elements shown in Table 6 are examples of the present invention.

As shown in FIG. 10, the elements D111 to D114 have a tradeoff relationship between the power consumption and the viewing angle characteristics, which is substantially similar to that of the element D101 in which the first charge transport layer 51 is a single layer and is formed of the material M2 that is the low refractive index material. In other words, this shows that the first charge transport layer 51 is not required to be in contact with the first emission layer 52 and the light extraction electrode 4.

Figure 11:
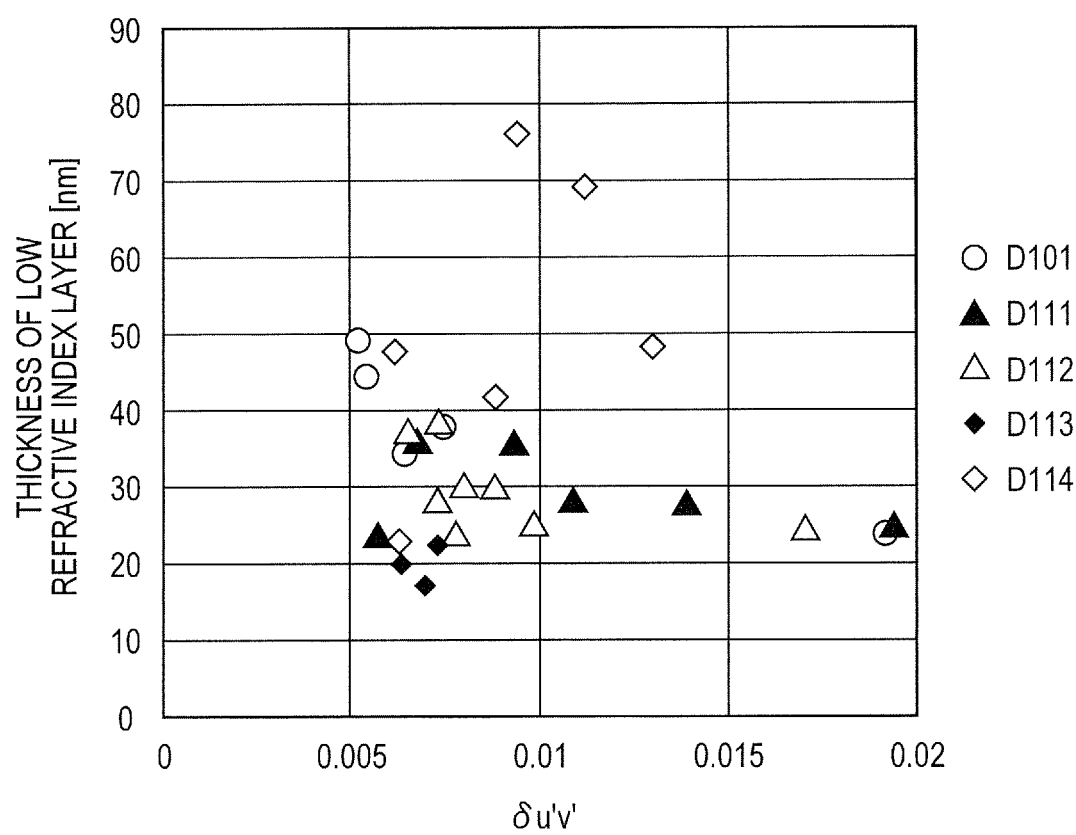
FIG. 11 is a graph showing a relationship between a thickness of a low refractive index layer and viewing angle characteristics.

FIG. 11 shows a relationship between the thickness of the low refractive index layer and the viewing angle characteristics of the elements D101 and D111 to D114. In FIG. 11, only Pareto optima are plotted at the time when the power consumption is 240 mW or less and δu'v' is 0.02 or less. It can be understood that, from FIG. 11, if the thickness is 15 nm or more, the effect of introducing the low refractive index layer can be obtained. An optimum thickness depends also on the refractive index of the material, and thus, is not necessarily required to be in this range. As a result of repeated studies, it was found that the optimum thickness is 10 nm or more.

In the above, it is shown that the low refractive index layer in the first charge transport layer 51 is not necessarily required to be in contact with the light extraction electrode 4 and the first emission layer 52, and that, by inserting the low refractive index layer in any place between the light extraction electrode 4 and the first emission layer 52, the effect of the present invention can be obtained.

[Refractive Index of First Charge Transport Layer 51]

Next, the magnitude of the refractive index of the first charge transport layer 51 with which the power consumption and the viewing angle characteristics are improved is described.

Figure 12:
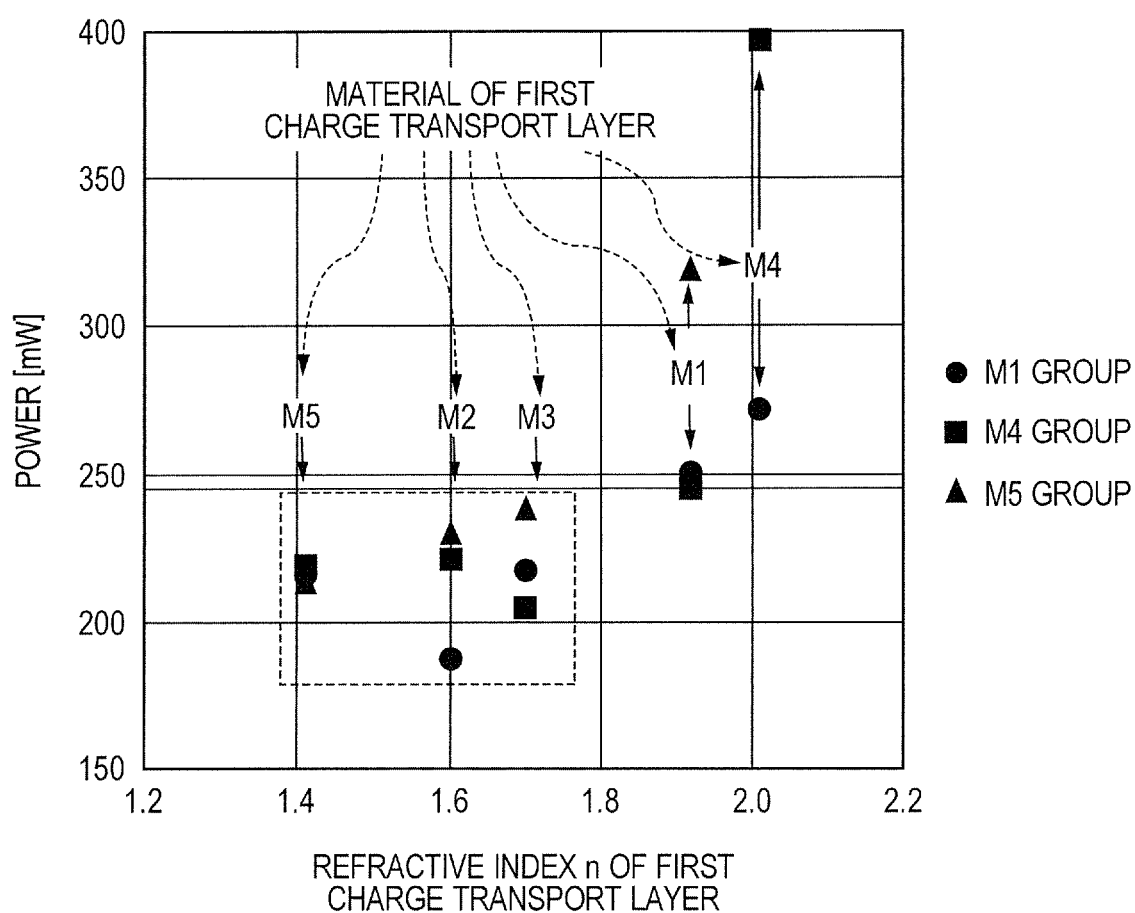
FIG. 12 is a graph showing a relationship between a refractive index of a first charge transport layer at $\lambda_1$ and power consumption at a time when $\delta u'v'=0.007$.

FIG. 12 shows a relationship between the refractive index of the first charge transport layer 51 at $\lambda_1$ and the power consumption at the time when δu'v'=0.007. In element groups M1, M4, and M5, the first emission layer 52 is doped only with BD, and the second emission layer 72 is mixedly doped with GD and RD. In the element groups M1, M4, and M5, all the emission layers 52 and 72 and the second to fourth charge transport layers 53, 71, and 73 are formed of the materials M1, M4, and M5, respectively, and a material of the first charge transport layer 51 is any one of the materials M1 to M5.

With reference to FIG. 12, when the first charge transport layer 51 is formed of the material M1 or M4, the power consumption is high, and there is a large difference in power consumption among the groups. On the other hand, it can be understood that, when the first charge transport layer 51 is formed of the material M2, M3, or M5 that is a low refractive index material, the power consumption is low, and the difference among the groups is small. In other words, it is shown that, in a region of high viewing angle characteristics, it is most effective in lowering the power consumption to form the first charge transport layer 51 as a low refractive index layer.

Ordinarily, a charge transport layer used has a refractive index at λ=455 nm of about 1.8 to 1.9. From FIG. 12, it can be understood that in a refractive index region surrounded by broken lines, the power consumption at the time when δu'v'=0.007 is 240 mW or less. In other words, it is desired that the refractive index at $\lambda_1$ of the first charge transport layer 51 be 1.70 or less.

In the above, it was shown that, only by setting the refractive index of the first charge transport layer 51 at $\lambda_1$ to be 1.7 or less, both the power consumption and the viewing angle characteristics were able to be improved. When an element is actually designed, the thickness may be selected so that desired specifications are met among Pareto optima of the power consumption and the viewing angle characteristics.

[Refractive Index of Non-Interfering Layer]

Next, influence of the refractive index of a non-interfering layer on the effect of setting the refractive index of the charge transport layer 51 to be lower according to the present invention is described.

Figure 13:
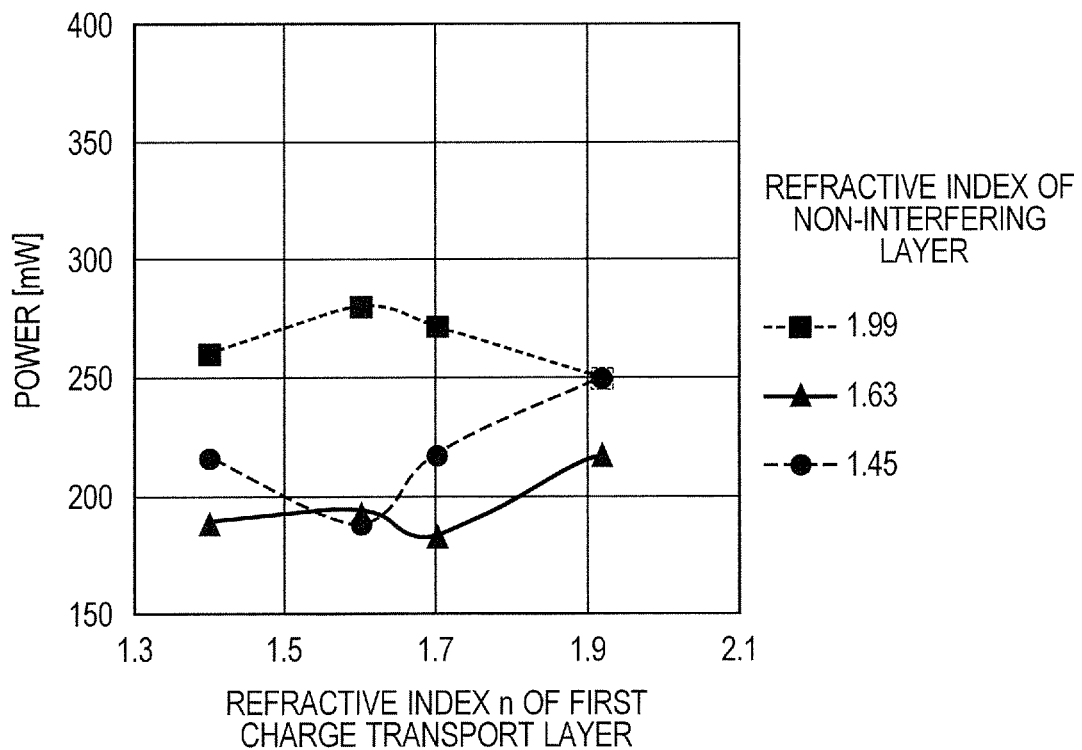
FIG. 13 is a graph showing a relationship between the refractive index of the first charge transport layer and power consumption at the time when $\delta u'v'=0.007$.

FIG. 13 shows a relationship between the refractive index of the first charge transport layer 51 and the power consumption at the time when δu'v'=0.007 in a case where the refractive index of the first emission layer 52 and the refractive index of the non-interfering layer are changed in the element D101. The refractive index of the first emission layer 52 and the refractive index of the non-interfering layer are values at the wavelength $\lambda_1$. As described in explanatory legends in FIG. 13, the refractive indices of the non-interfering layer are 1.45, 1.63, and 1.99. As shown in FIG. 13, when the refractive index of the non-interfering layer is 1.45, the power consumption is lowered in a region in which the refractive index of the first charge transport layer 51 is 1.7 or less. Similarly, when the refractive index of the non-interfering layer is 1.63, the power consumption in a region in which the refractive index of the first charge transport layer 51 is 1.7 or less is lower than that in a case in which the refractive index of the first charge transport layer 51 is 1.9 (material M1). In other words, there is an effect of setting the refractive index of the first charge transport layer 51 to be lower. On the other hand, when the refractive index of the non-interfering layer is 1.99, even if the refractive index of the first charge transport layer 51 becomes lower, the power consumption is not lowered. As a result of study, it was made clear that a desirable refractive index of the non-interfering layer on the light extraction side of the light extraction electrode 4 at the wavelength $\lambda_1$ is 1.65 or less.

[Refractive Index of Light Extraction Electrode 4]

Next, a preferred range of the refractive index of the light extraction electrode 4 at the wavelength $\lambda_1$ is described.

Figure 14:
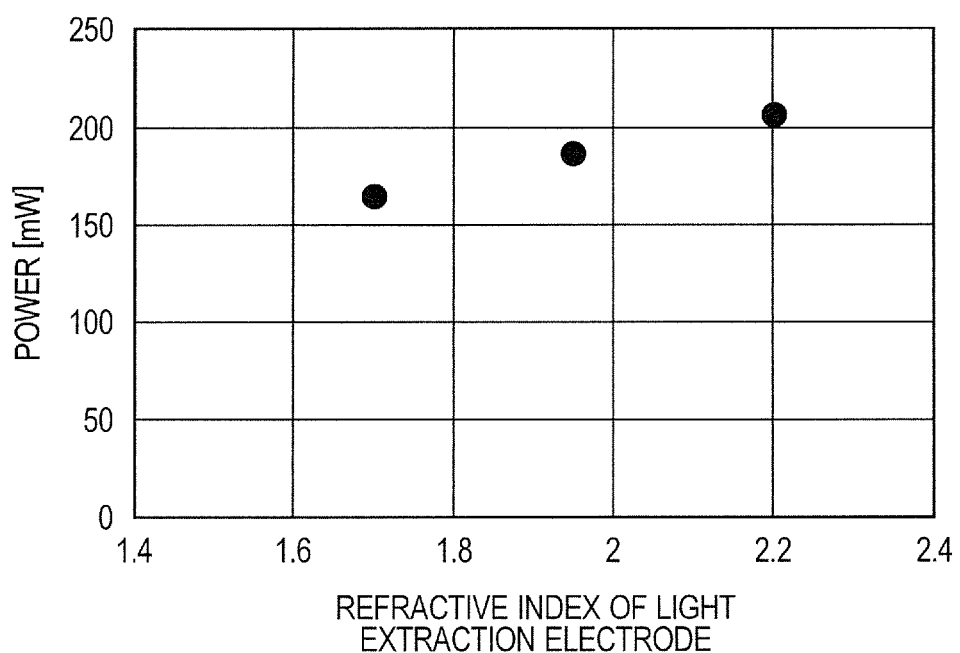
FIG. 14 is a graph showing a relationship between a refractive index of a light extraction electrode and power consumption at the time when $\delta u'v'=0.007$.

FIG. 14 shows a relationship between the refractive index of the light extraction electrode 4 and the power consumption at the time when δu'v'=0.007 in a case where the refractive index of the light extraction electrode 4 is changed in the element D101. The refractive index of the light extraction electrode 4 is a value at the wavelength K. From FIG. 14, it can be understood that, when the refractive index of the light extraction electrode 4 is 2.2, the power consumption is 206 mW, and, as the refractive index becomes smaller, the power consumption becomes lower. It was made clear that, from the present study, a desired refractive index of the light extraction electrode 4 is 2.2 or less.

[Effect of Introducing Low Refractive Index Layer into Another Charge Transport Layer (Second Organic Compound Layer or Third Organic Compound Layer)]

Next, it is described that, when the first charge transport layer 51 is formed as a low refractive index layer, it is further effective to form another charge transport layer 53, 71, or 73 as a low refractive index layer.

Figure 15:
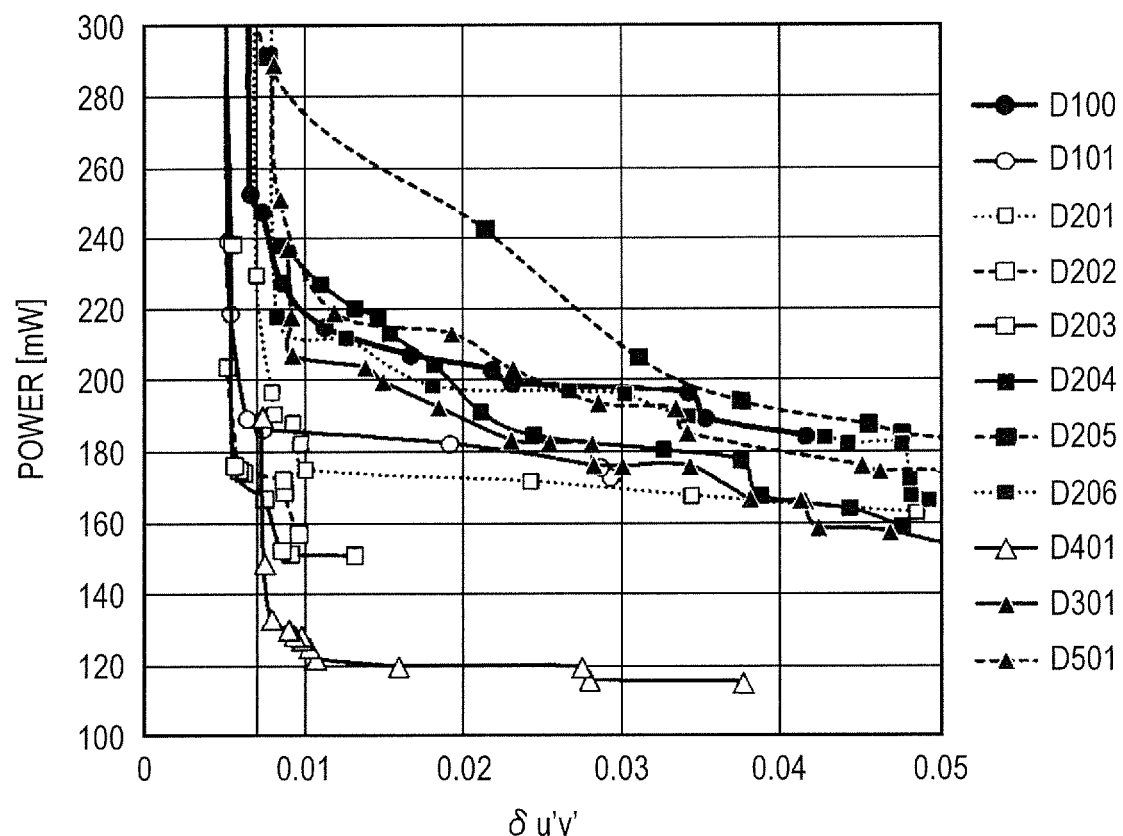
FIG. 15 is a graph showing a relationship between power consumption and viewing angle characteristics.

FIG. 15 shows a relationship between the power consumption and the viewing angle characteristics in elements shown in Table 7. FIG. 15 also shows the result with regard to the element D100 and the element D101 for comparison purposes. In FIG. 15, Examples of the present invention are plotted with hollow points, and Comparative Examples are plotted with solid points.

With reference to FIG. 15, some elements of Comparative Examples have the lowered power consumption in a region in which δu'v'>0.03, but, no significant difference exists in a region in which δu'v' is 0.02 or less. In other words, it can be understood that, even if only the charge transport layers 53, 71, and 73 other than the first charge transport layer 51 and the emission layers 52 and 72 are formed of the material M2, the tradeoff relationship between the power consumption and the viewing angle characteristics of the element D100 is not improved. As shown in FIG. 8, as in the elements D102 to D106, even if only the layers other than the first charge transport layer 51 are formed of the material M2, the effect of the present invention cannot be obtained. As is clear also from FIG. 15, it can be understood that, even if a low refractive index layer is additionally introduced into other layers of the elements D102 to D106 shown in FIG. 8, the extent of the tradeoff between the power consumption and the viewing angle characteristics is not significantly changed, and a clear effect of the introduction cannot be obtained. On the other hand, with regard to the elements as examples in which the first charge transport layer 51 is formed of the material M2, it can be understood that, by

TABLE 7

| Element | | First charge transport layer | First emission layer | | Second charge transport layer | Third charge transport layer | Second emission layer | | Fourth charge transport layer |
|---|---|---|---|---|---|---|---|---|---|
| | | | Dopant | Host | | | Dopant | Host | |
| D201 | Example | M2 | BD | M1 | M2 | M1 | RD + GD | M1 | M1 |
| D202 | Example | M2 | BD | M1 | M1 | M2 | RD + GD | M1 | M1 |
| D203 | Example | M2 | BD | M1 | M1 | M1 | RD + GD | M1 | M2 |
| D204 | Comparative example | M1 | BD | M1 | M2 | M2 | RD + GD | M1 | M1 |
| D205 | Comparative example | M1 | BD | M1 | M2 | M1 | RD + GD | M1 | M2 |
| D206 | Comparative example | M1 | BD | M1 | M1 | M2 | RD + GD | M1 | M2 |
| D401 | Example | M2 | BD | M1 | M2 | M2 | RD + GD | M1 | M2 |
| D301 | Comparative example | M1 | BD | M1 | M2 | M2 | RD + GD | M1 | M2 |
| D501 | Comparative example | M1 | BD | M2 | M2 | M2 | RD + GD | M2 | M2 |

In the elements shown in Table 7, the first emission layer 52 is doped only with BD, and the second emission layer 72 is mixedly doped with GD and RD. Further, at least two of the emission layers 52 and 72 and the charge transport layers 51, 53, 71, and 73 are formed of the material M2 that is a low refractive index material, and the other layers are formed of the material M1. In the elements D201 to D203, the first charge transport layer 51 is formed of the material M2, and any one of the other charge transport layers 53, 71, and 73 is formed of the material M2. The elements D201 to D203 are examples of the present invention. In the element D401, all the charge transport layers 51, 53, 71, and 73 are formed of the material M2. The element D401 is an example of the present invention. On the other hand, in the elements D204 to D206, the first charge transport layer 51 is formed of the material M1, and two of the other charge transport layers 53, 71, and 73 are formed of the material M2. The elements D204 to D206 are Comparative Examples. In the element D301, all the charge transport layers 53, 71, and 73 other than the first charge transport layer 51 are formed of the material M2, and, in the element D501, the emission layers 52 and 72 are also formed of the material M2. Both of the element D301 and the element D501 are Comparative Examples.

forming the charge transport layer 53, 71, or 73 other than the first charge transport layer 51 as a low refractive index layer, the power consumption is lowered while the viewing angle characteristics are hardly lost. In particular, there is a tendency that, as the number of the low refractive index layers becomes larger, the power consumption is lowered more. In other words, only after the first charge transport layer 51 is formed as a low refractive index layer, the effect of forming another charge transport layer as a low refractive index layer exhibits.

From this, it is preferred that, after the first charge transport layer 51 is formed as a low refractive index layer, another charge transport layer be formed as a low refractive index layer.

[Refractive Indices of Emission Layers 52 and 72]

Next, preferred ranges of the refractive indices of the first emission layer 52 and the second emission layer 72 at the wavelength $\lambda_1$ are described.

Figure 16:
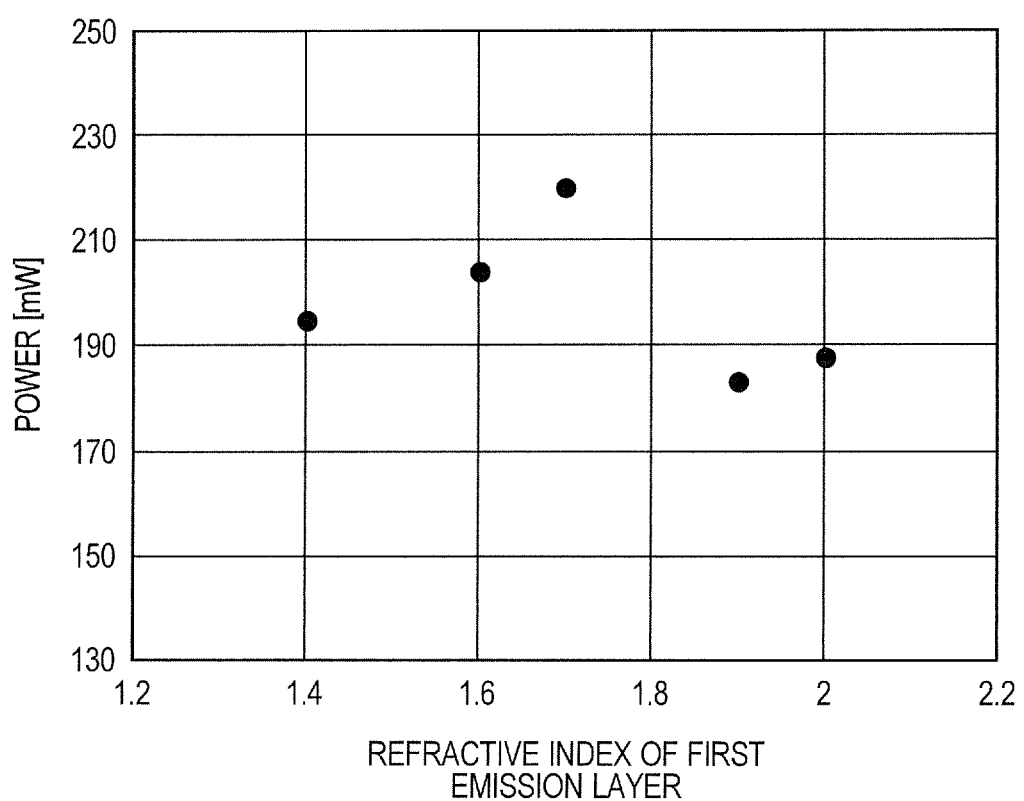
FIG. 16 is a graph showing a relationship between a refractive index of a first emission layer and power consumption at the time when $\delta u'v'=0.007$.

FIG. 16 shows a relationship between the refractive index of the first emission layer 52 and the power consumption at the time when δu'v'=0.007 in a case where the refractive index of the first emission layer 52 is changed in the element D101. The refractive index of the first emission layer 52 is a value at the wavelength $\lambda_1$. It can be understood that, from FIG. 16, when the refractive index of the first emission layer 52 is less than 1.8, the power consumption increases. In other words, the effect obtained by setting the refractive index of the first charge transport layer 51 to be lower is small. As a result of the analysis, it was made clear that a desired refractive index of the first emission layer 52 according to the present invention at the wavelength $\lambda_1$ is 1.8 or more and 2.1 or less. The same holds true for the second emission layer 72.

CONCLUSION

As described above, in a structure in which the order of interference is different among colors of emitted light such as in a tandem white-light-emitting element, a tradeoff relationship between the viewing angle characteristics and the power consumption often becomes a problem. This is because the luminous intensity distribution characteristics at the time when the interference condition of $3\lambda/4$ is satisfied have significantly larger angular dependence as compared with a case in which the interference condition of $\lambda/4$ is satisfied.

By forming the first charge transport layer 51 as a low refractive index layer, interference intensity of blue light emitted from the first emission layer 52 is enhanced, and at the same time, the angular dependence of the luminous intensity distribution characteristics at the time when the interference condition of $3\lambda/4$ is satisfied can be reduced. As a result, interference intensity of the second emission layer 72 can be enhanced, and the emission efficiency of the white-light-emitting element can be improved while the viewing angle characteristics are maintained. In other words, by setting the refractive index of the first charge transport layer 51 to be lower, both of the increased viewing angle and the lowered power consumption can be attained.

An organic light-emitting element according to the present invention can attain both a reduced power consumption and an increased viewing angle.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-098509, filed May 12, 2014, which is hereby incorporated by reference herein in its entirety.

REFERENCE SIGNS LIST

4: light extraction electrode (first electrode), 51: first charge transport layer (first organic compound layer), 52: first emission layer, 53: second charge transport layer (third organic compound layer), 60: charge generation layer, 71: third charge transport layer (third organic compound layer), 72: second emission layer, 73: fourth charge transport layer (second organic compound layer), 80: reflective electrode (second electrode)

The invention claimed is:

1. An organic light-emitting element for emitting white light comprising, in the stated order:
    a first electrode, the first electrode being a light extraction electrode;
    a first organic compound layer;
    a first emission layer, the first emission layer being an emission layer for emitting blue light and having a refractive index at a wavelength $\lambda_1$ that is larger than that of the first organic compound layer;
    a second organic compound layer having a refractive index at the wavelength $\lambda_1$ lower than that of the first emission layer;
    a second emission layer;
    a third organic compound layer having a refractive index larger than that of the first organic compound layer; and
    a second electrode, the second electrode being a reflective electrode,
    wherein an optical distance $L_1$ between the first emission layer and the second electrode satisfies Expression (a), and an optical distance $L_2$ between the second emission layer and the second electrode satisfies Expression (b):

$$(\lambda_1/8)\times(3-(2\varphi_1/\pi))<L_1<(\lambda_1/8)\times(5-(2\varphi_1/\pi)) \quad (a),$$

$$(\lambda_2/8)\times(-(2\varphi_2/\pi)-1)<L_2<(\lambda_2/8)\times(-(2\varphi_2/\pi)+1) \quad (b),$$

where $\lambda_1$ is a maximum peak wavelength of light emitted from a light-emitting material included in the first emission layer, $\lambda_2$ is a maximum peak wavelength of light emitted from a light-emitting material included in the second emission layer, $\varphi_1$ is a phase shift upon reflection of the light having the maximum peak wavelength $\lambda_1$ at the second electrode, and $\varphi_2$ is a phase shift upon reflection of the light having the maximum peak wavelength $\lambda_2$ at the second electrode.

2. The organic light-emitting element according to claim 1, further comprising a non-interfering layer formed on a light extraction side of the first electrode,
    wherein a refractive index of the non-interfering layer at the wavelength $\lambda_1$ is 1.65 or less.

3. The organic light-emitting element according to claim 1, wherein a refractive index of the first electrode at the wavelength $\lambda_1$ is 2.2 or less.

4. The organic light-emitting element according to claim 1,
    wherein the second emission layer comprises two kinds of light-emitting materials, and
    wherein the wavelength $\lambda_2$ comprises one of a maximum peak wavelength of light that is emitted from any one of the two kinds of light-emitting materials and a maximum peak wavelength of light formed by mixing light beams that are emitted from the two kinds of light-emitting materials.

5. The organic light-emitting element according to claim 4, wherein the two kinds of light-emitting materials of the second emission layer comprise a light-emitting material for emitting red light and a light-emitting material for emitting green light.

6. The organic light-emitting element according to claim 1, wherein a refractive index of the third organic compound layer at the wavelength $\lambda_1$ is 1.70 or less.

7. The organic light-emitting element according to claim 1, wherein a refractive index of the first emission layer at the wavelength $\lambda_1$ is 1.8 to 2.1.

8. The organic light-emitting element according to claim 1, further comprising a charge generation layer formed between the first emission layer and the second emission layer.

9. A display device comprising a plurality of light emission points, the plurality of light emission points comprising the organic light-emitting element according to claim 1.

10. An image information processing apparatus comprising:
   an input unit for inputting image information; and
   a display unit for displaying the image information,
   the display unit comprising the display device according to claim 9.

11. A lighting apparatus comprising:
   the organic light-emitting element according to claim 1; and
   a circuit for supplying a drive current to the organic light-emitting element.

12. A lighting apparatus comprising:
   the organic light-emitting element according to claim 1; and
   a heat dissipation member.

13. An electrophotographic image forming apparatus comprising:
   a photosensitive member;
   a charging unit for charging the photosensitive member;
   an exposure unit for exposing the photosensitive member; and
   a developing unit for developing an electrostatic latent image formed on the photosensitive member,
   the exposure unit comprising the organic light-emitting element according to claim 1,
   the organic light-emitting element comprising a plurality of organic light-emitting elements disposed in a line along a long axis direction of the photosensitive member.

14. An organic light-emitting element comprising, in the stated order:
   a transparent electrode;
   a first organic compound layer;
   a first emission layer;
   a second organic compound layer;
   a second emission layer;
   a third organic compound layer; and
   a reflective layer,
   wherein a refractive index of the first organic compound layer is lower than that of the first emission layer,
   a refractive index of the second organic compound layer is lower than that of the first emission layer, and
   a refractive index of the third organic compound layer is larger than that of the first emission layer.

15. The organic light-emitting element according to claim 14,
   the transparent electrode being a light extraction electrode;
   the reflective layer being a reflective electrode,
   wherein an optical distance $L_1$ between the first emission layer and the reflective layer satisfies Expression (a), and an optical distance $L_2$ between the second emission layer and the reflective layer satisfies Expression (b):

$$(\lambda_1/8) \times (3 - (2\varphi_1/\pi)) < L_1 < (\lambda_1/8) \times (5 - (2\varphi_1/\pi)) \qquad (a),$$

$$(\lambda_2/8) \times (-(2\varphi_2/\pi) - 1) < L_2 < (\lambda_2/8) \times (-(2\varphi_2/\pi) + 1) \qquad (b),$$

where $\lambda_1$ is a maximum peak wavelength of light emitted from the first emission layer, $\lambda_2$ is a maximum peak wavelength of light emitted from the second emission layer, $\varphi_1$ is a phase shift upon reflection of the light having the maximum peak wavelength $\lambda_1$ at the reflective layer, and $\varphi_2$ is a phase shift upon reflection of the light having the maximum peak wavelength $\lambda_2$ at the reflective layer.

16. A display device comprising a plurality of pixels, the plurality of light emission points comprising the organic light-emitting element according to claim 14.

17. An image information processing apparatus comprising:
   an input unit for inputting image information; and
   a display unit for displaying the image information,
   the display unit comprising the display device according to claim 14.

18. A lighting apparatus comprising:
   the organic light-emitting element according to claim 14; and
   a heat dissipation member.

\* \* \* \* \*